US006640084B2

(12) United States Patent
Pande et al.

(10) Patent No.: US 6,640,084 B2
(45) Date of Patent: Oct. 28, 2003

(54) COMPLETE OUTDOOR RADIO UNIT FOR LMDS

(76) Inventors: Krishna Pande, 12200 Galesville Dr., Gaithersburg, MD (US) 20878; Guobao Zheng, 2519 James Maury Dr., Oakhill, VA (US) 20171; Tho Nguyen, 13471 Point Pleasant Dr., Chantilly, VA (US) 20151; Lee Phelps, 7905 Clearfield Rd., Frederick, MD (US) 21702; Ali I. Bawangaonwala, 18864 Bent Willow Cir., Germantown, MD (US) 20874; Sunil M. Nagabhushana, 13660 Bay Berry La., Centreville, VA (US) 20121; Eric Funk, 1705 Vineyard Trail, Annapolis, MD (US) 21401

( * ) Notice: Subject to any disclaimer, the term of this patent is extended or adjusted under 35 U.S.C. 154(b) by 490 days.

(21) Appl. No.: 09/725,240

(22) Filed: Nov. 29, 2000

(65) Prior Publication Data

US 2002/0065052 A1 May 30, 2002

Related U.S. Application Data

(60) Provisional application No. 60/179,731, filed on Feb. 2, 2000, provisional application No. 60/179,405, filed on Feb. 1, 2000, provisional application No. 60/179,406, filed on Feb. 1, 2000, provisional application No. 60/179,407, filed on Feb. 1, 2000, provisional application No. 60/179,408, filed on Feb. 1, 2000, provisional application No. 60/179,409, filed on Feb. 1, 2000, and provisional application No. 60/179,410, filed on Feb. 1, 2000.

(51) Int. Cl.$^7$ ................................................ H04H 1/00
(52) U.S. Cl. ........................ 455/3.01; 455/76; 455/81; 361/688; 361/704
(58) Field of Search ............................. 455/3.01, 3.02, 455/3.05, 73, 90, 128, 130, 82, 78, 67.5; 219/208, 209; 361/688, 702, 703, 704, 705, 707, 708–712, 715–719

(56) References Cited

U.S. PATENT DOCUMENTS

| 5,045,971 | A | * | 9/1991 | Ono et al. | ................... | 361/386 |
| 5,771,449 | A | * | 6/1998 | Blasing et al. | ............... | 455/422 |
| 5,844,939 | A | | 12/1998 | Scherer et al. | | |
| 5,862,462 | A | * | 1/1999 | Tyner et al. | ................. | 455/129 |

OTHER PUBLICATIONS

Qualcomm Product Data Book, Qualcomm Incorporated, pp. 123–165, downloaded Sep. 15, 2000 from URL http://www.qualcomm.com/cdmatechnologies/vlsi/q3236.html.

* cited by examiner

Primary Examiner—Nay Maung
Assistant Examiner—Tanmay Lele
(74) Attorney, Agent, or Firm—Richard C. Litman

(57) ABSTRACT

The complete outdoor radio unit for LMDS is a light weight, compact transceiver featuring planar circuitry. The transceiver uses cross polarization through an orthomodal transducer and frequency offset between transmit and receive to provide isolation between the transmitter and receiver. The transceiver includes three printed circuit boards directly attached by thermally conductive epoxy to a heat sink which forms part of the antenna dish/transceiver housing for effective heat transfer. Two of the waveguides are used as receiver and transmitter transmission lines into the orthomodal transducer, and two of the waveguides are used as bandpass filters. The transceiver also includes a DC—DC converter in the power supply which is modified to connect the base plate to the heat sink for compactness and improved heat transfer, and a frequency synthesizer with a phase locked loop hardwired to a single reference frequency for compact size.

20 Claims, 20 Drawing Sheets

COMPLETE OUTDOOR RADIO UNIT FOR LMDS

CROSS-REFERENCE TO RELATED APPLICATION

This application claims the benefit of U.S. Provisional Patent Application Serial Nos. 60/179,405, filed Feb. 1, 2000; 60/179,406, filed Feb. 1, 2000; 60/179,407, filed Feb. 1, 2000; 60/179,408, filed Feb. 1, 2000; 60/179,409, filed Feb. 1, 2000; 60/179,410, filed Feb. 1, 2000; and 60/179,731, filed Feb. 2, 2000.

BACKGROUND OF THE INVENTION

1. Field of the Invention

The present invention relates to microwave radio transmitters and receivers, and particularly to a transceiver which constitutes a complete outdoor radio unit for the Local Multipoint Distribution Service (LMDS).

2. Description of the Related Art

The Local Multipoint Distribution Service (LMDS) is a wireless, broadband technology which is expected to provide a variety of communications services, including video distribution, high speed Internet access, real-time multimedia file transfer, video conferencing, and telecommunications, both for residential and commercial applications. LMDS systems use very high frequencies, the actual spectrum allocation varying from country to country. In the United States, the FCC auctioned licenses for the LMDS in 1998 for two blocks of frequencies located in the 28 GHz band and the 31 GHz band of the spectrum. The short wavelength at such frequencies means that communications in the LMDS is line of sight. Prototype systems use hubs or base stations mounted on towers spaced apart every few kilometers (4–5 kilometers, or about 2.5–3.1 miles apart) to repeat signals and to serve as the centers of cells which service several thousand subscribers, including residences and businesses by transmission to small rooftop antennas. LMDS may be integrated with conventional data transmission techniques, such as twisted pair or fiber optic cables, in a hybrid system. The transmission to subscribers could be by fiber optic cable, but a more likely scenario may be transmission by fiber optic cable to the base unit and retransmission to subscriber units by radio wave, as the advantage offered by LMDS lies partly in the elimination of hardwiring each subscriber unit, and partly in the increased speed of transmission and larger bandwidths by radio wave as opposed to transmission by modem over telephone lines.

Nevertheless, many LMDS systems remain at the prototype level due to technical problems with transceiver equipment and with systems integration. Several problems exist with conventional LMDS transmitter and receiver equipment.

Conventional LMDS transmitter and receiver equipment uses a plurality of discrete modules or components, increasing system costs and entailing loss of efficiency. A conventional transmitter may have a plurality of modules built in separate packages which are connected together. For example, a high power amplifier module may be connected to an upconverter and then attached to a connectorized filter and finally to the antenna feed. This construction approach requires developing techniques for matching the separate modules, and increases costs by the separate packaging of the modules, as well as the loss of transmitter power from coupling the components, with consequent decrease in transmitter power efficiency. Therefore, there is a need for an LMDS transceiver which reduces the number of separate modules in an LMDS transmitter-receiver system.

A further problem with microwave transceiver design is the multiplication of components and internal layout of the transceiver within the housing. Modern microwave transmitter and receiver designs typically use frequency synthesizers having phase lock loop circuitry under the direction of a microprocessor. Such a system is outlined in U.S. Pat. No. 5,844,939, issued Dec. 1, 1998 to Scherer et al. Further, a Product Data Book from Qualcomm Incorporated, CDMA Technologies, of San Diego, Calif. describes the Qualcomm® CDMA Technologies Phase-Locked Frequency Synthesizer integrated circuit Q3236® at pages 126–168, and a method of hardwiring the frequency synthesizer to operate at a single frequency without the requirement of a microprocessor at pages 126, 131. Further, connections between circuit boards frequently require a plurality of cables, some being used for high frequency signals and others being used to transfer DC voltages between circuit boards. It would therefore be desirable to reduce the number of discrete components and improve the internal architecture of a transceiver for the LMDS by providing better matching sections.

Another problem encountered in transceivers for LMDS operation is efficient heat transfer. Many transceivers rely upon air convection for the cooling of electronic components, and require a fan to force air flow through the housing. While effective, this design approach increases transceiver size and cost. Further, printed circuit boards in conventional microwave transceivers usually use silver, copper molybdenum, and copper tungsten as carrier material for attachment by conventional solder connections. Such carrier materials are not as efficient heat conductors as copper, and traditional solder connections are not flexible, causing attached components to break during expansion and contraction of the printed circuit boards. Consequently, it is desirable to have a transceiver for LMDS operation with improved heat transfer properties in order to house the transceiver in a smaller package.

None of the above inventions and patents, taken either singularly or in combination, is seen to describe the instant invention as claimed. Thus a complete outdoor radio unit for lmds solving the aforementioned problems is desired.

SUMMARY OF THE INVENTION

The complete outdoor radio unit for LMDS is a light weight, compact transceiver featuring planar circuitry. The transceiver uses cross polarization through an orthomodal transducer to provide isolation between the transmitter and receiver. The transceiver includes three printed circuit boards directly attached by thermally conductive epoxy to a heat sink which forms part of the antenna dish/transceiver housing for effective heat transfer. One of the three circuit boards is a millimeter wave circuit board, which is attached to the heat sink by a millimeter ground plane. The millimeter ground plane has a plurality of cavities defined therein which form the lower portion of waveguide assemblies. Two of the waveguides are used as receiver and transmitter transmission lines into the orthomodal transducer, and two of the waveguides are used as bandpass filters. The waveguides interface with the millimeter wave board through microstrips. The millimeter wave board is connected to the other circuit boards by a flex cable using thin film conductive strips to accommodate both high frequency and DC voltages. The transceiver also includes a DC—DC converter in the power supply which is modified to connect the base plate to the heat sink for compactness and improved heat transfer, and a frequency synthesizer with a phase locked loop hardwired to a single reference frequency for compact size. Optionally, the transceiver may be equipped with a five-pole edge coupled bandpass filter constructed from thin film rather than lumped components.

The transceiver includes three printed circuit boards, including a power supply board, an L-band microwave circuit board, and a millimeter wave printed circuit board. The power supply board and the L-band microwave circuit board are directly adhered to a planar ground plane/heat sink which forms part of the antenna housing by a thermally conductive epoxy, and hence are coplanar. The millimeter wave printed circuit board is adhered to a second ground plane by thermally conductive epoxy, the second ground plane being attached directly to the heat sink so that the second ground plane is coplanar with the first two printed circuit boards, giving the transceiver a planar configuration with all three circuit boards attached to the heat sink for effective heat transfer.

Connections between circuit boards are facilitated by a novel flex cable fabricated using thin film techniques and which allows both microwave frequency signals and DC signals to be transferred using the same cable. Optionally, an edge coupled five pole bandpass filter including a dielectric substrate having thin film strips arranged in a precise pattern and a metallic lid placed 50–60 mils from the filter may be provided for rejection of image frequencies and for filtering the local oscillator frequencies from the desired signal in high power transceivers.

The transceiver includes several measures for improved heat sinking and transfer in an essentially planar, air tight housing, including direct attachment of the printed circuit boards to the housing, the use of a gold plated copper heat sink, the elastic attachment of the circuit boards to the heat sink by thermally conductive epoxies, and a novel method of attaching a DC—DC converter to the printed circuit board by extending the mounting pins to the same side as the base plate for direct attachment of the base plate to the heat sink while including a number of via holes in the heat sink for improved heat dissipation.

The transceiver reduces the number of components required in order to achieve a planar circuitry architecture by providing the improved flex cable mentioned above, and by hardwiring the parallel bus on the phase locked loop chip used in the frequency synthesizer in order to eliminate the need for a microprocessor.

Accordingly, it is a principal object of the invention to provide a complete outdoor radio unit for LMDS embodying a transceiver with light weight, compact planar circuitry for improved efficiency and lower cost.

It is another object of the invention to provide an LMDS receiver with antenna launch ports directly on the circuit boards and waveguide filters integrated with the microwave printed circuit boards to eliminate coaxial cable coupling between the transceiver and antenna, thereby reducing component cost and power loss associated with an antenna feed line.

It is a further object of the invention to provide an LMDS transceiver with improved heat sink and heat transfer properties in order to provide a compact transceiver which does not depend upon forced air flow through the housing for cooling of electronic components.

Still another object of the invention is to reduce the number of components in an LMDS transceiver through the use of flex cables which permit connecting intermediate frequency and DC signals between printed circuit boards on the same cable and through hardwiring the phase locked loop in the frequency synthesizer in order to reduce component cost and transceiver size.

Yet another object of the invention is to provide an edge coupled bandpass filter for LMDS frequencies in order to reduce the number of waveguide filters required, thereby reducing transceiver size.

It is an object of the invention to provide improved elements and arrangements thereof for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
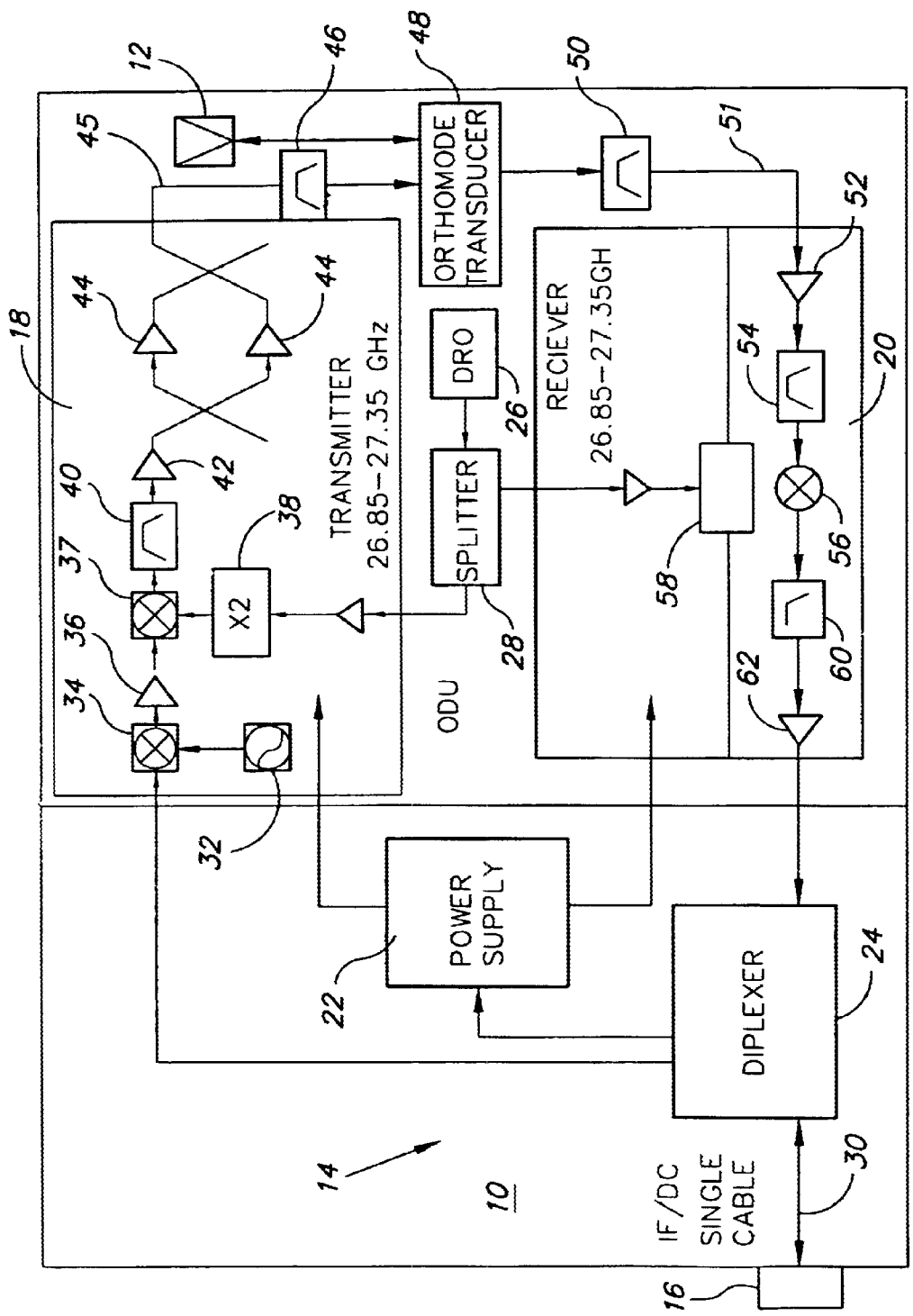
FIG. 1 is a block diagram of a complete outdoor radio unit for LMDS according to the present invention.

The present invention is a complete outdoor radio unit for LMDS, reference generally as 10 in the attached drawings. As shown in FIG. 1, the unit 10 has an antenna 12 and a transceiver 14 connected to the antenna 12. The antenna 12 includes a plastic dish (not shown) with a housing at the rear center of the dish for receiving the transceiver 14 and an antenna horn inserted through an aperture in the dish. The antenna dish is a conventional dish manufactured by AEMI and will not be described further in the present application. The transceiver 14 is mounted on the rear wall of the antenna housing, and serves as a heat sink and ground plane as described further below. The housing provides an airtight and weatherproof seal to protect the transceiver 14 from the elements.

The radio unit 10 is designed for use in the Local Multipoint Distribution Service, and may be operated in the 28 to 31 GHz range in the United States, or it may be adapted for use in the frequency ranges authorized by other countries in the international community by simple adjustment of the bandpass filters as outlined below. The unit 10 may be operated as a base unit in a cell of LMDS units, in which case the transmitter operates at an output power of one watt, or as a subscriber unit, in which case the transmitter operates at an output power of about ¼ watt. Power to the unit is supplied through a coaxial cable input at connector 16, and the output power of the transmitter may be varied by the power input through terminal 16.

The transceiver 14 includes a transmitter 18 and a receiver 20 for transmitting and receiving frequency modulated (FM) signals. Isolation between the transmitter 18 and receiver 20 is provided by orthogonal or cross polarization. The transceiver 14 of the present invention uses linear or planar polarization, as opposed to circular polarization. Consequently, if the transmitter 18 emits a vertically polarized electric field, the receiver 20 is designed to receive a horizontally polarized electric field, and vice versa. Consequently, in an LMDS cell using the transceiver 14 of the present invention, if the transmitter 18 of the base unit is vertically polarized, the receiver 20 of the subscriber units is also vertically polarized, while the receiver 20 of the base unit and transmitters 18 of the subscriber units are horizontally polarized. Likewise, the polarization of the transceiver 14 of other base units which communicate with the base unit of the cell will have transmitter 18 and receiver 20 polarization orthogonal to the orientation of the cell's base unit.

The transceiver 14 includes certain elements common to both the transmitter 18 and the receiver 20, such as a power supply 22 for supplying proper voltages, a diplexer 24 for switching between receive and transmit functions, a dielectric resonance oscillator (DRO) 26 for providing a stable local oscillator signal of about 13.2 GHz, and a splitter 28 for splitting the DRO 26 signal between the transmitter 18 and receiver 20. A greatly simplified explanation of the transceiver functions with reference to FIG. 1 follows.

When operated as a transmitter, an incoming signal at an intermediate frequency of about 400 MHz to 700 MHz is input to the transceiver 14 through coaxial connector 16 and rides on the DC power supply voltage through a common cable 30 to diplexer 24. The DC power supply voltage is filtered off and used as a supply source for power supply 22. The diplexer 24 switches the signal to the transmitter 18, where it is modulated with an intermediate frequency (IF) of about 1.8 GHz generated by local oscillator 32 in first mixer 34. The modulated IF signal (the difference frequency between about 1100–1400 MHz) is amplified at 36 and applied to second mixer 37, where the signal is further upconverted in frequency by the 13.2 GHz signal supplied by DRO 26 after frequency doubling to about 26.4 GHz at 38, and subsequently filtered by bandpass filter 40 to a frequency between about 27.5 to 27.8 GHz. After amplification by the driver amplifier at 42 and optional additional power amplification at 44, the signal is transmitted by waveguide transmission line 45 to filter 46 which is part of orthomodal transducer 48, and then to antenna 12. Orthomodal transducers are known in the electronics art, and have been used in various applications, so that its structure will not be further described herein. In this application, the orthomodal transducer 48 is used to allow a single antenna 12 to maintain orthogonal polarization of transmitted and received signals, so that waves of a first orientation are applied from the transmitter 18 to the antenna 12, while waves of an orthogonal orientation are applied from the antenna 12 to the receiver 20.

When operated as a receiver, a radio frequency (rf) signal of between about 27.8 and 28.35 GHz is received by antenna 12 and directed by orthomode transducer 48 through filter 50, which is part of the orthomode transducer 48, to waveguide transmission line 51 to receiver amplifier 52. The signal is then applied to bandpass filter 54 and mixer 56, where it is combined with the signal of 13.2 GHz supplied by DRO 26 after frequency doubling to about 26.4 GHz at 58. The resulting intermediate frequency signal (the difference frequency between about 1450 MHz to 1950 MHz) is applied to filter 60, amplifier 62 and diplexer 24, where it is switched to cable 30 and routed to the subscriber via coaxial cable. The signal is further processed by an appropriate receiving device in the subscriber's dwelling or commercial establishment, according to whether the signal is telephony, video, data communications, etc.

It will be noted that the center of the transmitter passband is 27.65 GHz, while the center of the receiver passband is about 28.07 GHz, and further that the edges of the transmit and receive passbands do not overlap. The offset in the passbands, together with relatively high Q bandpass filters with sharp skirts, works in conjunction with orthogonal polarization of the transmit and receive signals to provide isolation between the transmitter and receiver.

Figure 2:
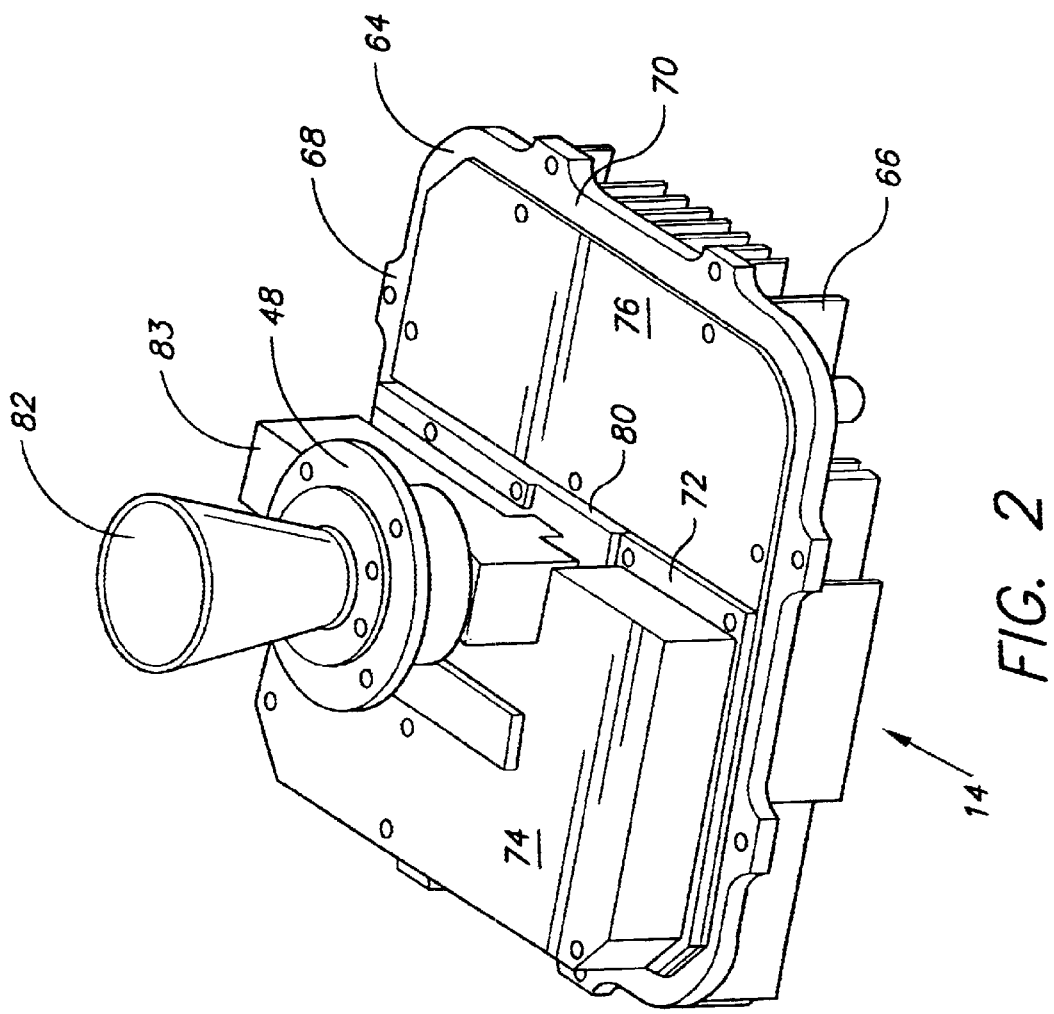
FIG. 2 is a diagrammatic perspective view of the transceiver of a complete outdoor radio unit for LMDS according to the present invention.

FIG. 2 is a diagrammatic view of the transceiver 14, showing the layout of the major features of the transceiver architecture. Electronic components on the circuit boards and other lumped components have been omitted for clarity. The transceiver 14 is mounted on a heat sink 64 which also forms the rear of the antenna dish(not shown)/transceiver housing. The heat sink 64 has a plurality of fins 66 on its outer surface for radiating heat to the atmosphere and a plurality of mounting flanges 68 about its perimeter for mounting the transceiver to the antenna dish/transceiver housing by bolts. A gasket (not shown) or other seal is placed between the heat sink 64 and the antenna dish/transceiver housing to form an air tight and waterproof seal. Advantageously, the inner surface 70 of the heat sink is coated with gold plated copper both to form a ground plane and to form a surface having better heat conduction properties than printed circuit board carriers used in conventional transceivers, which use either silver, copper molybdenum or copper tungsten surfaces for their ability to form solder joints.

Figure 3:
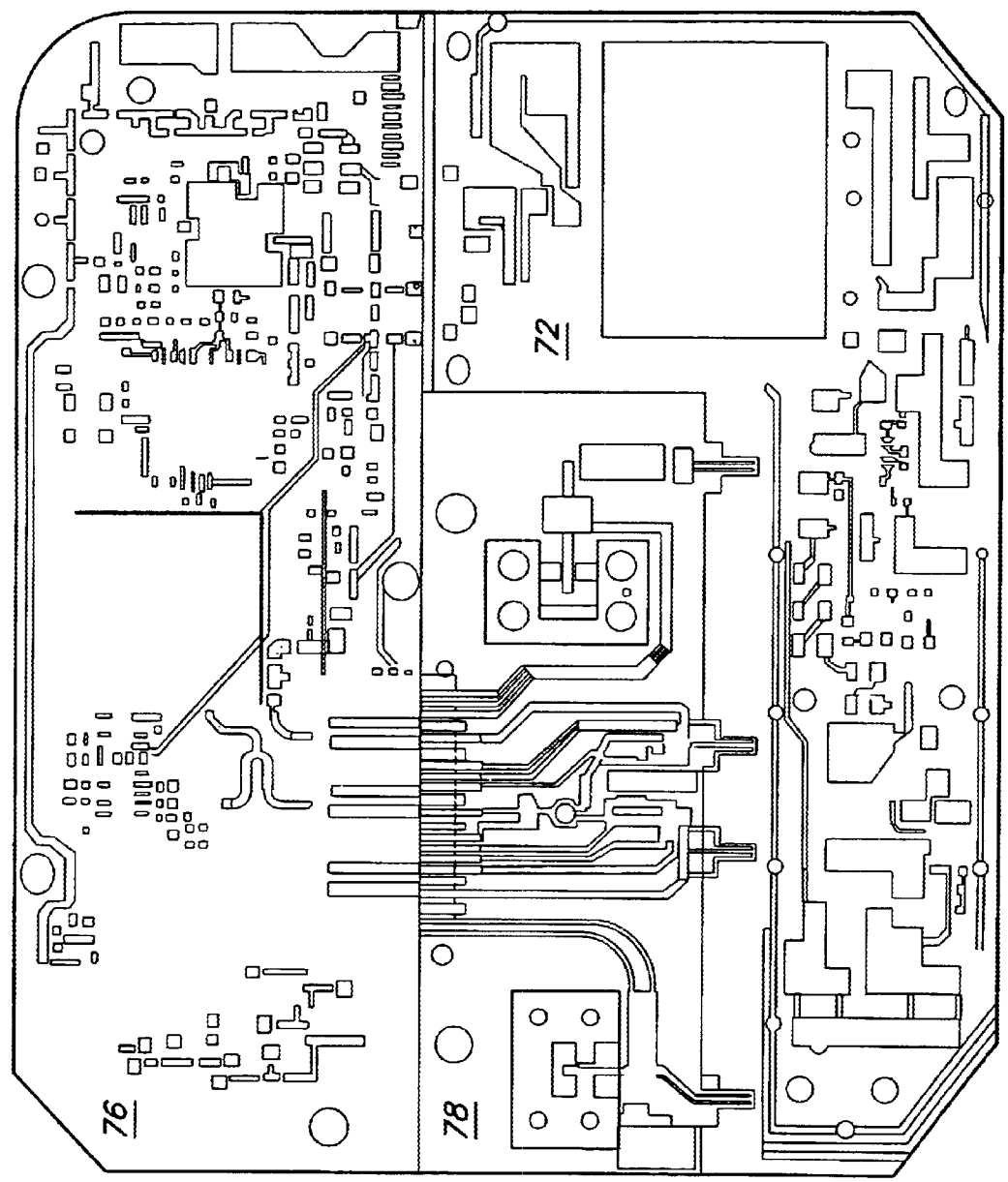
FIG. 3 is a plan view showing the alignment of the three printed circuit boards of the transceiver on the heat sink according to the present invention.
Figure 4:
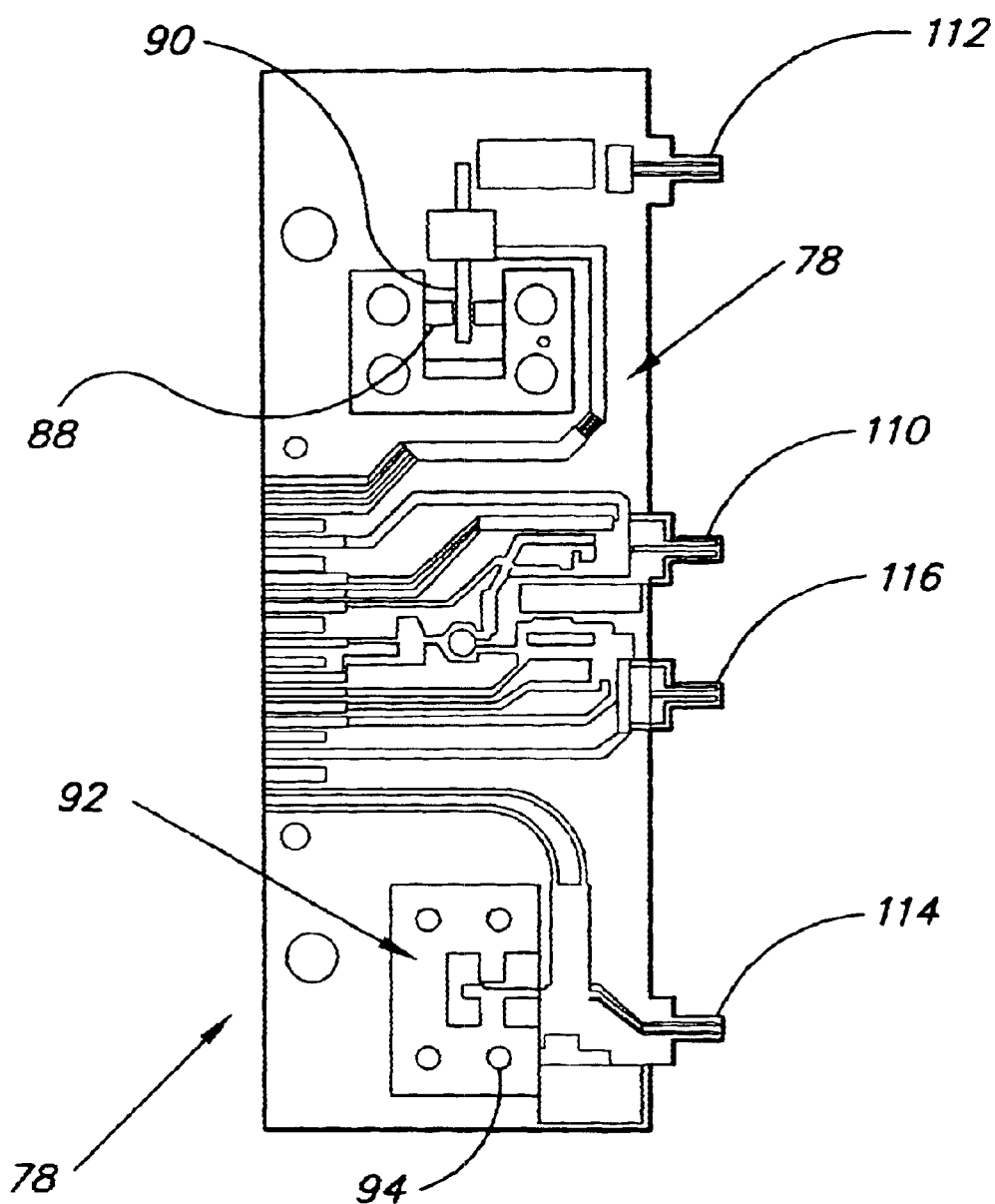
FIG. 4 is a plan view of the millimeter wave printed circuit board according to the present invention.

The transceiver 14 is constructed using three printed circuit boards, including an L-shaped power supply board 72, shown covered by shielding 74 in FIG. 2, an L-band microwave circuit board 76 (as used herein, L-band refers to a range of frequencies between about 950 MHz to 2050 MHz), and a millimeter wave printed circuit board 78 (shown in FIGS. 3 and 4). The power supply board 72 and the L-band microwave circuit board 74 are attached directly to the heat sink 64 by newly developed epoxies which have good thermal conduction properties and which also have elastic properties as well. In a preferred embodiment, the epoxy used to attach the circuit boards 72 and 76 to the heat sink 64 is 5025E conductive perform, made by Ablestick Laboratories. The bottom surface of the L-band microwave circuit board 76 is copper clad in order to form a ground plane, as is well known in the art of microwave electronics. By this construction the entire bottom surface of the circuit boards 72 and 76 are attached directly to the heat sink 64 for improved heat transfer, and the elastic properties of the epoxy permits the circuit boards 72 and 76 to expand and contract without breaking, as would otherwise occur if they were attached to the heat sink 64 by rigid solder joints.

The millimeter wave printed circuit board 78 is not attached directly to the heat sink 64, but is adhered to a ground plane 80 (referred to in the present application as a millimeter ground plane to distinguish the ground plane defined by the top surface 70 from the ground plane 80 on which the millimeter wave board 78 is mounted) by the same epoxies which secure the power supply 72 and L-band 76 boards to the heat sink 64. The millimeter ground plane 80 (seen most clearly in FIG. 5) is a plate about ⅛ to ¼ inch thick made from brass or other thermally and electrically conductive material. The millimeter ground plane 80 is attached directly to the top surface 70 of the heat sink 64 by hardware, the thermal conductivity of the millimeter ground plane 80 permitting heat generated by the circuitry on the millimeter wave printed circuit board 78 to be transferred by conduction to the heat sink 64 where it may be dissipated by radiation and cooling at the fins 66. Thus, as shown in FIG. 3 with the components mounted above the circuit boards 72, 76, and 78 removed, the three circuit boards on which the active electronic components are mounted are laid in a substantially rectangular, planar architecture, with two of the three boards (72 and 76) having their entire bottom surface in direct immediate contact with the heat sink, and with the third circuit board 78 having its entire bottom surface in contact with the heat sink 64 through the medium of millimeter ground plane 80.

Referring again to FIG. 2, the transceiver 14 has an antenna horn 82 mounted on the orthomodal transducer 48. The transducer 48 is mounted on the upper half 83 of waveguide assemblies 45 and 51. As shown more clearly in FIGS. 4, 5, and 6, millimeter ground plane 80 has a first, or transmit, cavity 84 and a second, or receive, cavity 86 defined therein, each cavity 84 and 86 extending only partially into the thickness of ground plane 80 and therefore having a depth less than the thickness of ground plane 80. Cavity 84 forms the bottom portion of the transmitter waveguide 45, the waveguide 45 continuing through the transmitter launch point 88 defined in the millimeter wave circuit board 78 and through a continuation of the cavity 84 through the upper half 83 of the waveguide 45 into filter 46 of the orthomode transducer 48. The signal is introduced into waveguide 45 by microstrip 90 defined on circuit board 78, the microstrip 90 projecting from millimeter wave circuit board 78 into cavity 84.

Receive cavity 86 forms the bottom portion of receiver waveguide 51, the waveguide 51 continuing through the receiver launch point 92 defined in the millimeter wave circuit board 78 and through a continuation of cavity 86 through the upper half 83 of the waveguide 51, joining filter 50 of orthomode transducer 48. A received signal is introduced through antenna horn 82 of antenna 12 through orthomode transducer 48 and transducer filter 50 to waveguide 51 and is received by microstrip 94 on millimeter wave circuit board 78, which projects into cavity 86, and is thereby introduced to the electronic circuitry on board 78.

The components on millimeter wave board 78 are designed to handle signals having a wavelength between about 9 mm (25 GHz) and 12 mm (33.3 GHz), and includes six Microwave Monolithic Integrated Circuits (MMICs), as well as other microelectronic components such as capacitors, etc., for performing amplification, mixing, frequency multiplication, oscillation, etc., and which are secured to the board by epoxy, preferably EPO-TEK-H20E conductive paste manufactured by Epoxy Technology.

Hence, millimeter wave board 78 is integrated into waveguides 45 and 51, thereby eliminating the need for coaxial cable to couple signals to and from the antenna 12. It is known in the art to introduce or withdraw a signal into a waveguide by a microstrip (a flat strip of conductive metal or circuit trace deposited on dielectric, with a ground plane on the opposite side of the dielectric). However, applicant believes the transfer of the signal directly from an rf circuit board to a waveguide by microstrip, continuing the waveguide into an orthomode transducer and the antenna horn so that all components are directly connected without the necessity for a coaxial transmission line is unique. It will be note that cavities 84 and 86 have a generally rectangular configuration with a length longer than the width, and that the orientation of the cavities 84 and 86 are orthogonal to each other, in accordance with the orthogonal polarization of the transmit and receive signals. It will further be noted that antenna horn 82 is shown as conical in the drawings, although horn 82 may be rectangular or pyramidal.

Figure 5:
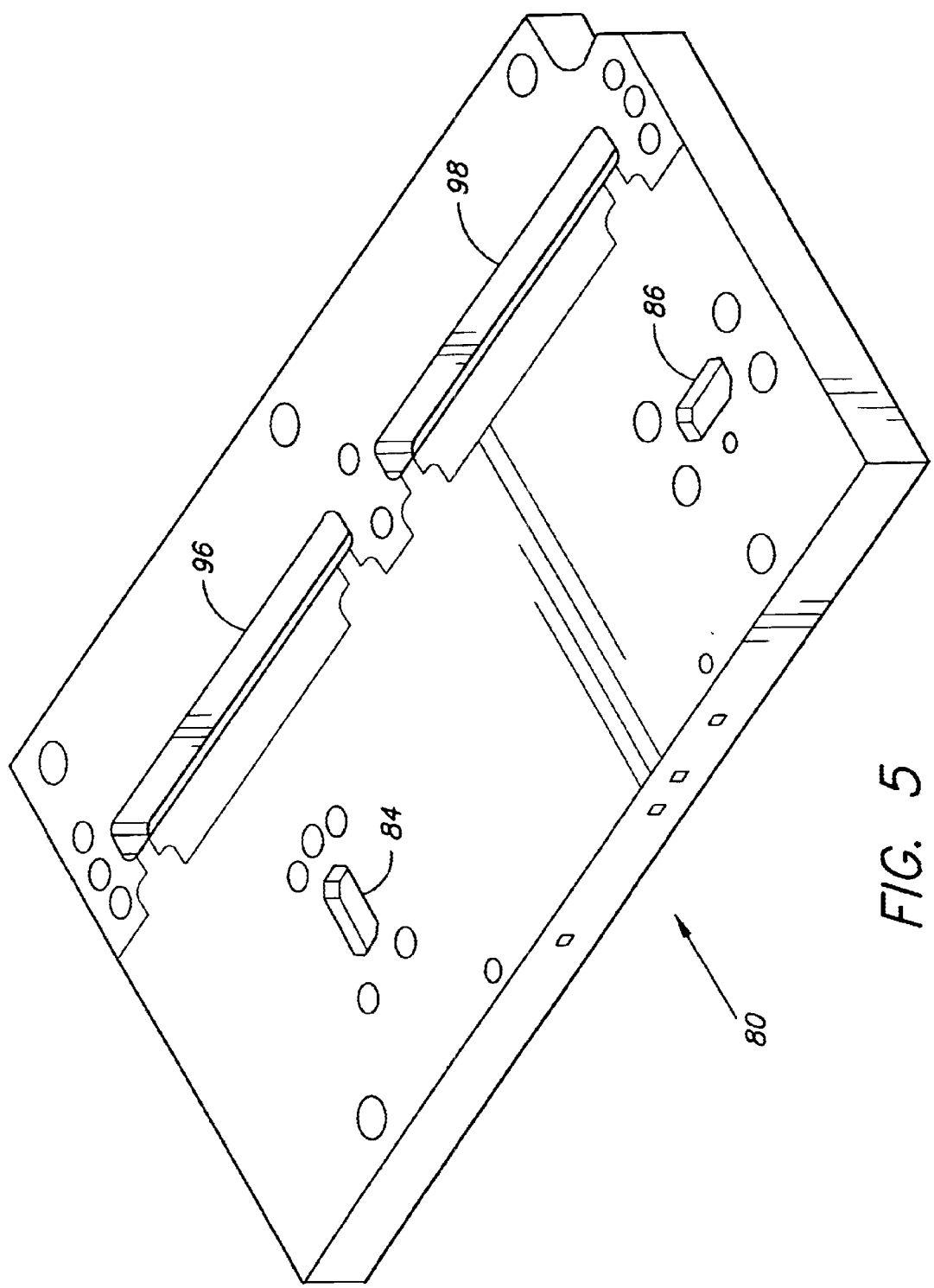
FIG. 5 is a perspective view of the millimeter wave ground plane according to the present invention.
Figure 6:
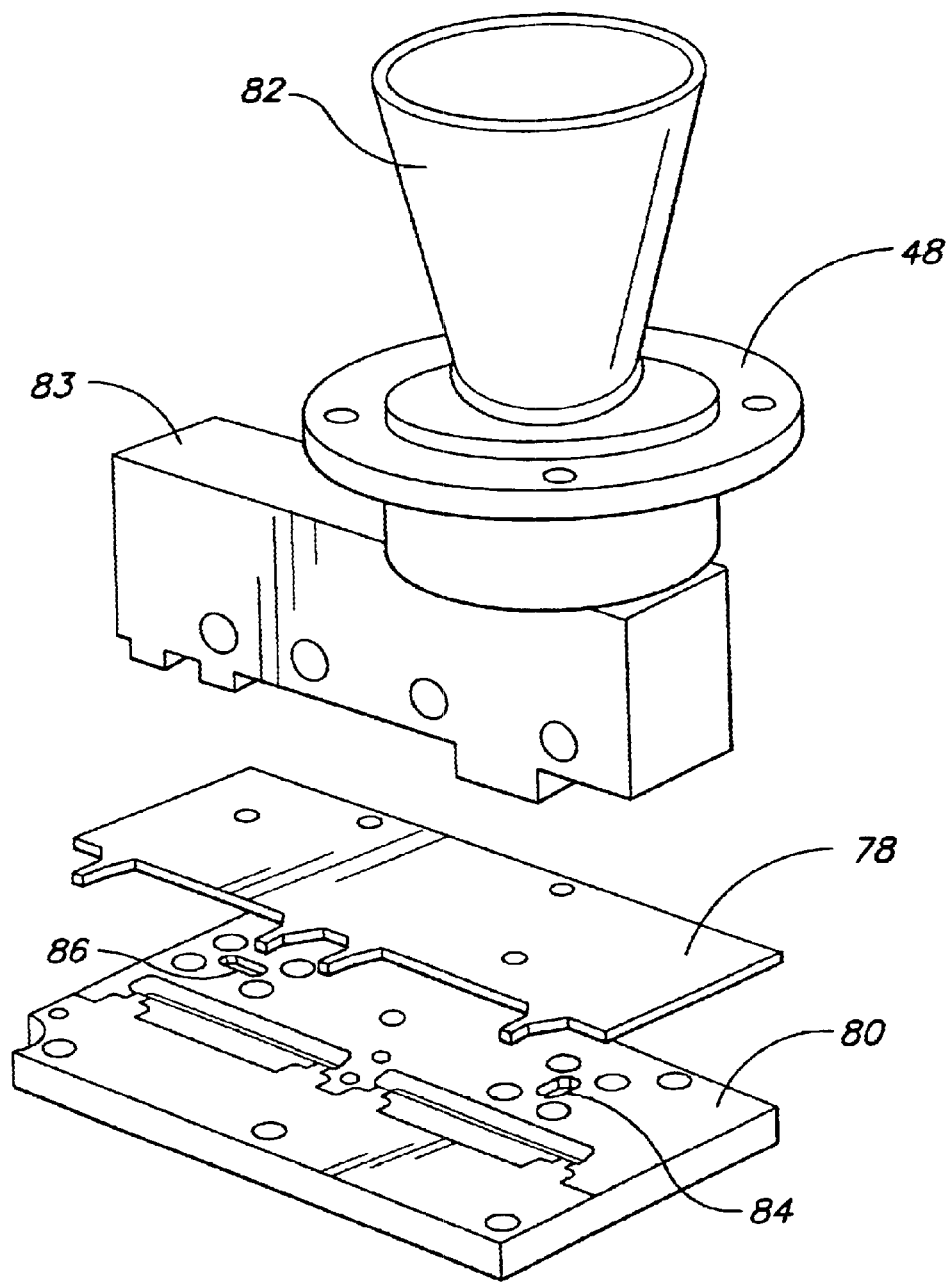
FIG. 6 is an exploded view of the antenna horn-to-millimeter wave circuit board assembly according to the present invention.
Figure 7:
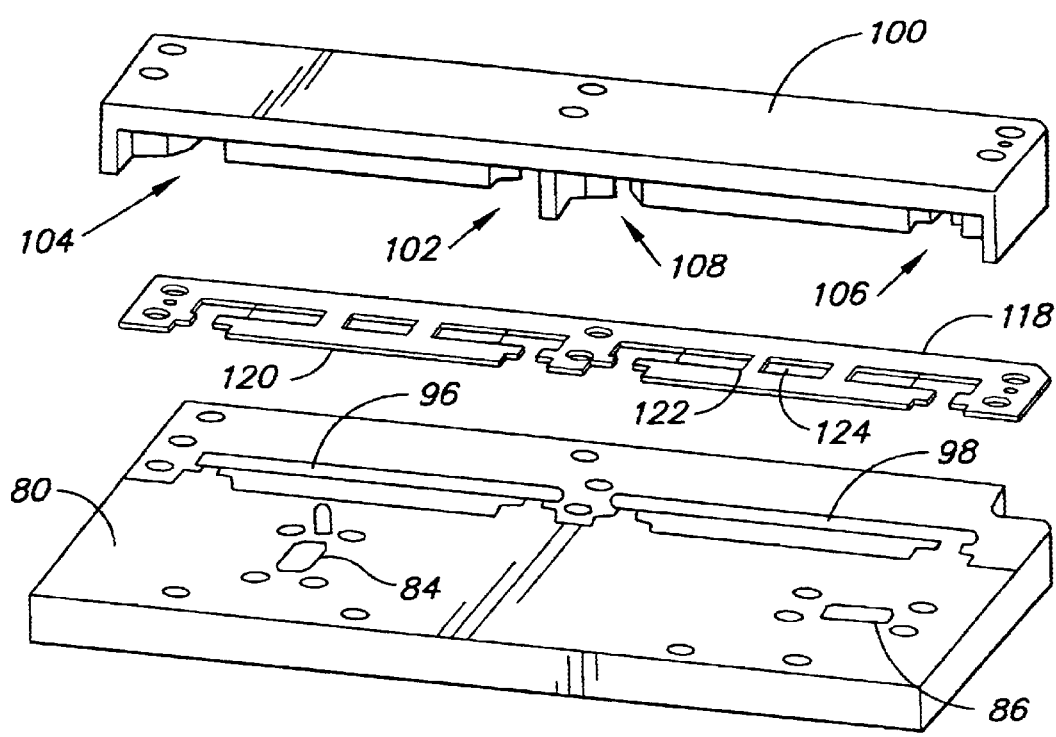
FIG. 7 shows an exploded view of the waveguide filter assembly according to the present invention.

Referring now to FIGS. 4, 5, and 7, it will be seen that ground plane 80 further has the bottom portion of a third cavity 96 and the bottom portion of a fourth cavity 98 defined therein, the cavities extending only partially into the thickness of the ground plane 80. Upper filter housing 100 is seated above ground plane 80 and contains the upper portion of third cavity 96 and fourth cavity 98. The third 96 and 98 fourth cavities are elongated laterally and generally rectangular in cross section, third cavity 96 defining transmitter waveguide bandpass filter 40, and fourth cavity 98 defining receiver waveguide bandpass filter 54. Upper filter housing 100 has four ports defined therein, including transmitter input port 102, transmitter output port 104, receiver input port 106, and receiver output port 108. Signals enter and leave the waveguide filters via microstrip filter launching points which project from a side of millimeter wave printed circuit board 78 and are partially inserted into the waveguide cavities 96 and 98 through ports 102 through 108. The filter launching points include transmitter input 110, transmitter output 112, receiver input 114, and receiver output 116. The range of frequencies passing through the filters are adjusted by a removable flat brass insert 118 which is placed between the ground plane 80 and the upper filter housing 100. The insert 118 has a pair of elongated rails 120 joined by a plurality of transverse fins 122 which define rectangular openings or irises 124. The bandpass range of frequencies is adjusted by varying the width of the fins 122 to change the dimensions of the irises 124. In this manner the operating range of the transceiver 14 may be adjusted for the different frequency bands permitted by various countries, simply by changing the insert 118. The incorporation of the filter launching points on the millimeter wave circuit board into the waveguide filters 40 and 54 eliminates the need for coaxial cable for coupling to the filters, resulting in compact size and reduced insertion loss. Further, the use of removable insert 118 to alter the passband of the filters makes the transceiver much more easily adaptable to the LMDS bands of different countries, since it is not necessary to remove and replace tubular waveguides to alter the frequencies in the passband.

Figure 8:
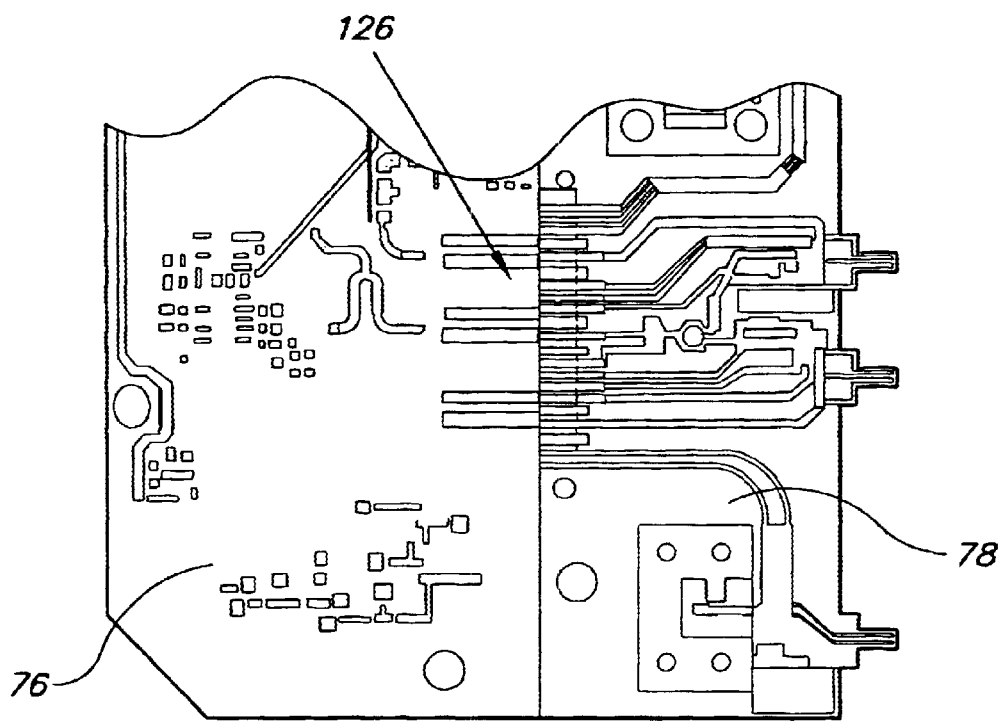
FIG. 8 shows a fragmented plan view of a flex cable connecting the millimeter wave circuit board with an L-band microwave circuit board according to the present invention.
Figure 9:
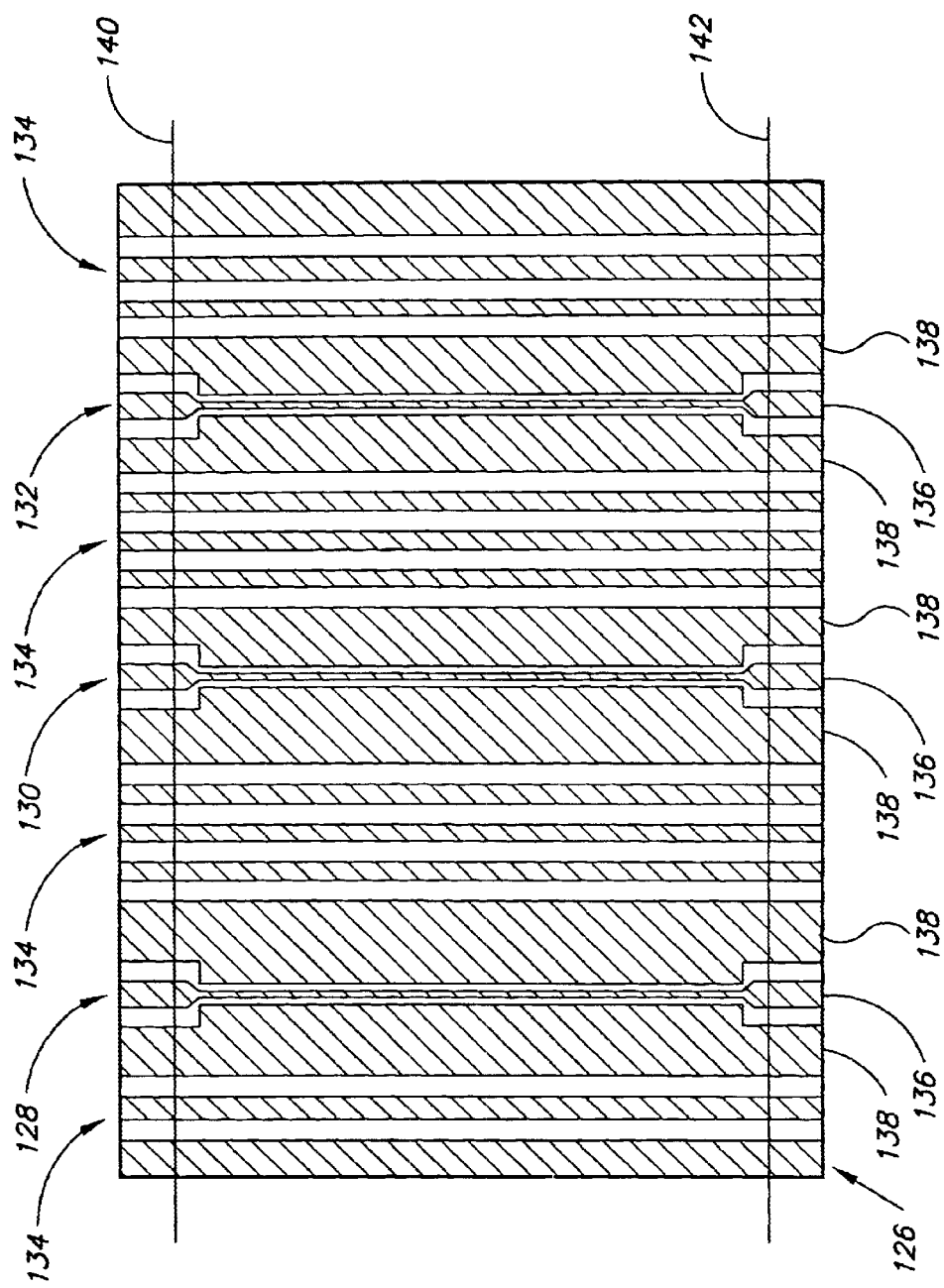
FIG. 9 shows a diagrammatic view of the layout of the thin film conductors in the flex cable according to the present invention.

As shown in FIGS. 8 and 9, the transceiver 14 uses a unique flex cable 126 to pass both microwave signals and DC voltages between the millimeter wave printed circuit board 78 and the L-band printed circuit board 76. FIG. 8 shows and environmental view with the circuit boards 76 and 78 fragmented, while FIG. 9 shows a photolithographic pattern of the arrangement of conductors in the cable 126. The cable 126 consists of a plurality of coplanar conductive strips imprinted on and encased within a polyimide substrate. The cable 126 includes first 128, second 130 and third 132 high frequency conductors, among which are interspersed a plurality of DC conductors 134. In order to convey high frequencies without stray inductance or capacitance causing coupling with the adjacent DC conductors, each high frequency conductor 128, 130 and 132 includes a center conductor 136 which carries the signal and a pair of wide ground planes strips 138 on adjacent sides of the center conductor 136, much after the pattern of a coplanar waveguide. The width and spacing of the center conductors 136 and ground plane strips 138 are designed for low insertion loss and excellent flatness in the intermediate frequency ranges of 1 to 2 GHz using simulation software. The cable 126 is prepared by depositing printed circuit board traces on a layer of polyimide using thin film techniques, and then covering the traces with another layer of polyimide so that the conductive strips are embedded in polyimide. The ends of the flex cable 126 as designated by the lines 140 and 142 in FIG. 9, are soldered directly to the circuit boards 76 and 78. The use of a single flexible cable 126 to transfer DC and control voltages, as well as high frequency signal voltages, between circuit boards is advantageous in reducing cabling requirements and contributing to compact size.

Figure 10:
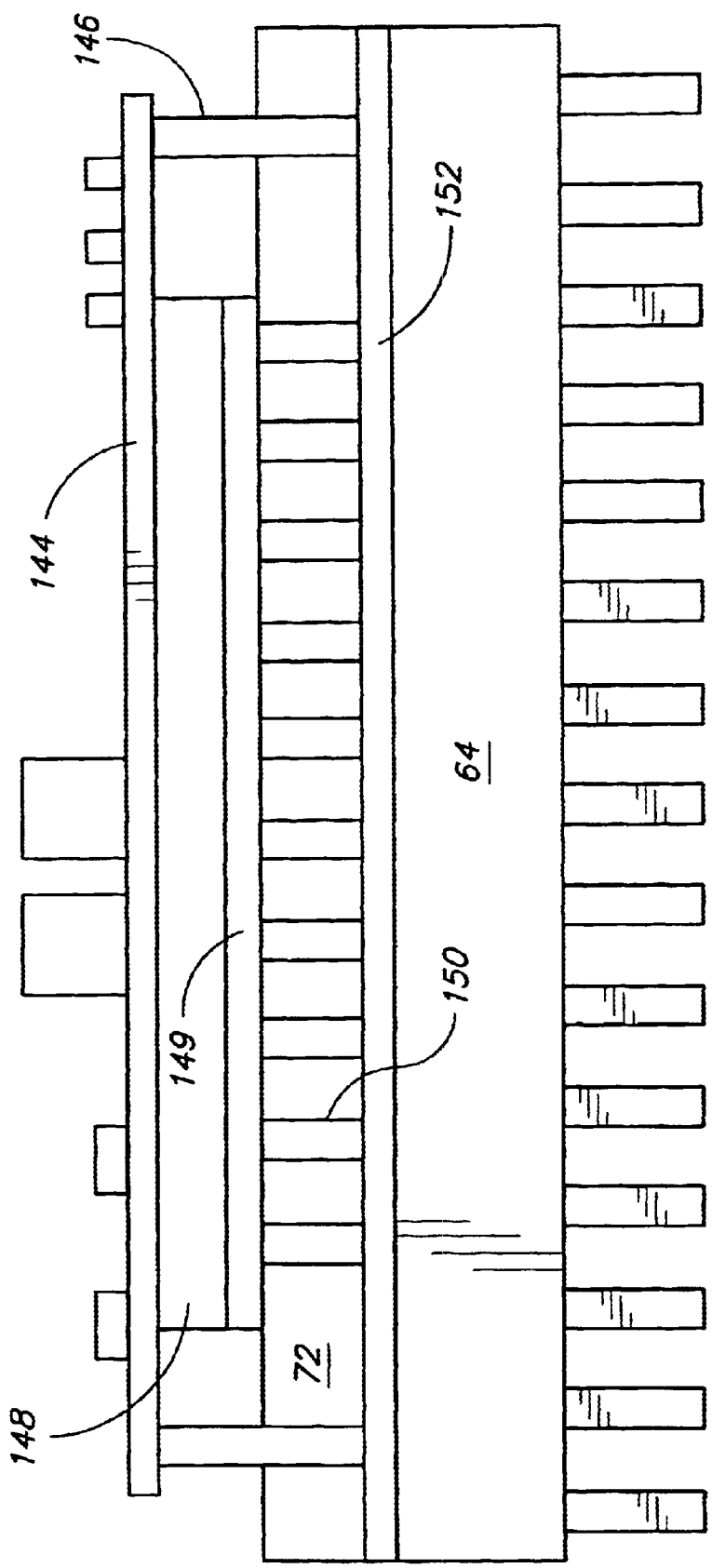
FIG. 10 is a diagrammatic side view showing the attachment of a DC—DC converter to a heat sink according to the present invention.

The power supply board 72 includes a DC—DC converter 144, shown in FIG. 10, for providing a variety of regulated DC voltages to various circuits and electrical components in the transceiver 14. DC—DC converters develop considerable heat in operation and require a heat sink. Typically a conventional DC—DC converter 144 will have mounting pins 146 for attaching the converter 144 to a circuit board mounted on the opposite side of the converter 144 from the base plate 148 which is used for attachment of a heat sink so that a convention, vertically oriented heat sink may be attached to the base plate for cooling by air flow through the electronic device. Because of the planar design of the transceiver 14 of the present invention, the transceiver is enclosed in an airtight housing and it is not possible to flow air through the transceiver above the circuit boards for cooling the components. Consequently, the DC—DC converter 144 used in the present invention has the mounting pins 146 extending from the same side of the converter 144 as the base plate 148 so that the converter 144 can have a thermal path from the base plate 148 to the heat sink 64. As shown in FIG. 10, the DC—DC converter 144 is attached to power supply printed circuit board 72 by mounting pins 146. Base plate 148 is attached to circuit board 72 by a standard heat sink compound, such as T-404-Chimerics double-sided adhesive tape 149. The portion of the power supply printed circuit board 72 below the base plate has a spacer 152 between the circuit board 72 and heat sink 64. Circuit board 72 has a plurality of via holes 150 defined therein for facilitating a path for the dissipated heat to the heat sink 64. In this manner the DC—DC converter 144 uses the same heat sink as the three printed circuit boards 72, 76 and 78 and the power supply board 72 is provided with adequate heat sinking while maintaining the compact, planar configuration of the transceiver 14.

Figure 11:
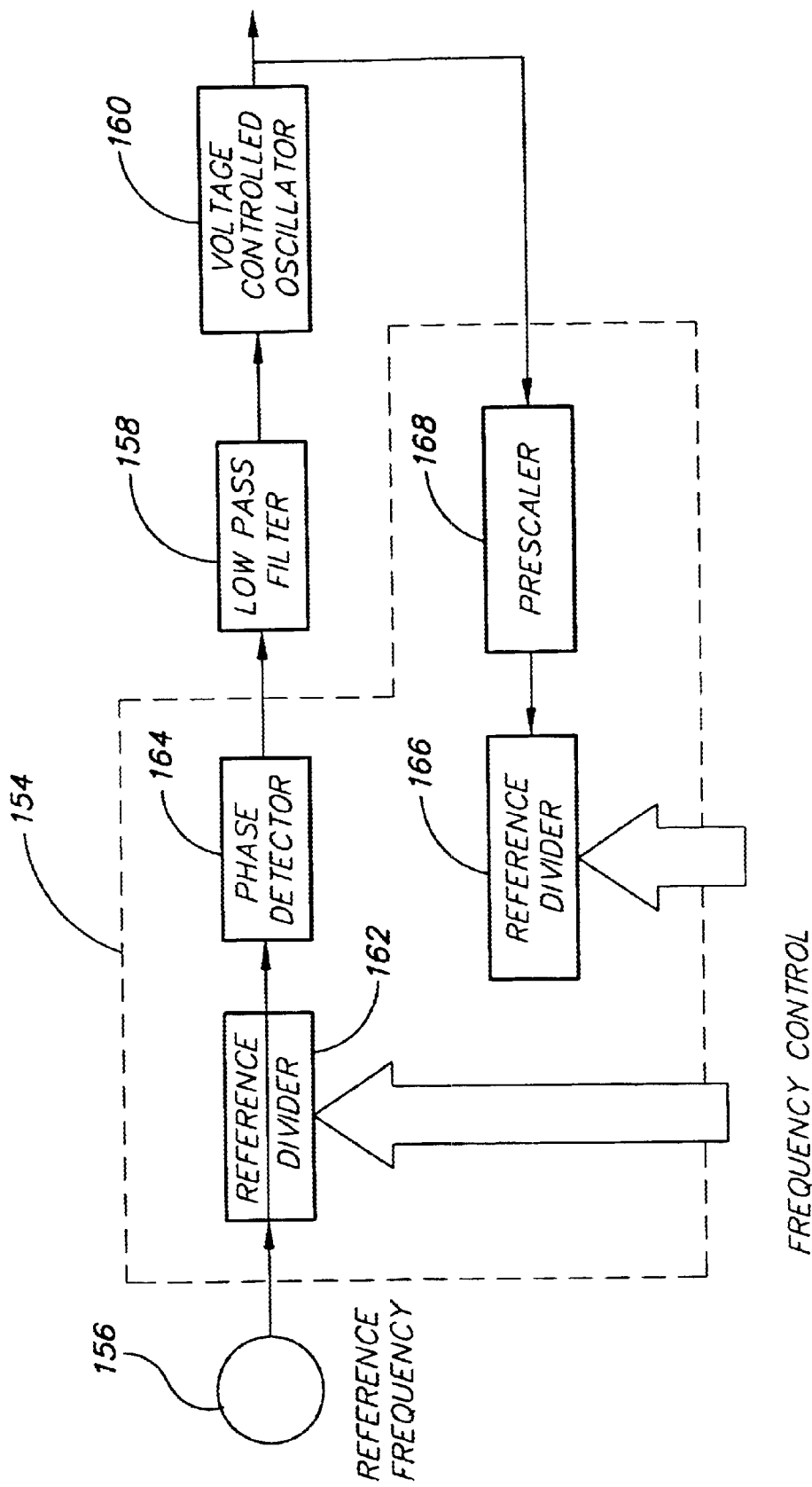
FIG. 11 is a block diagram of a frequency synthesizer used in the transceiver according to the present invention.
Figure 12A:
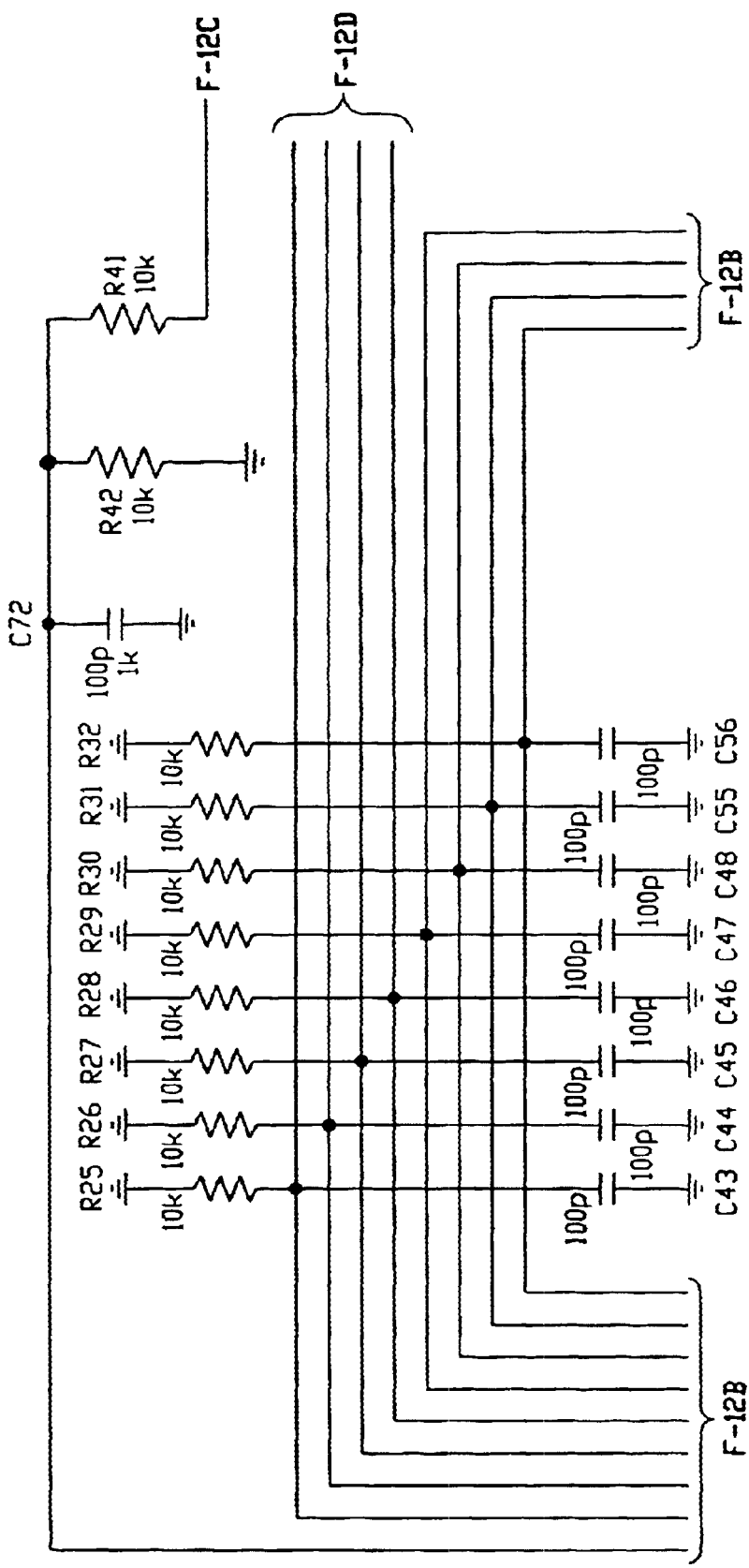
FIG. 12 is a schematic diagram showing the pin connection of the phase locked loop integrated circuit according to the present invention.
Figure 12B:
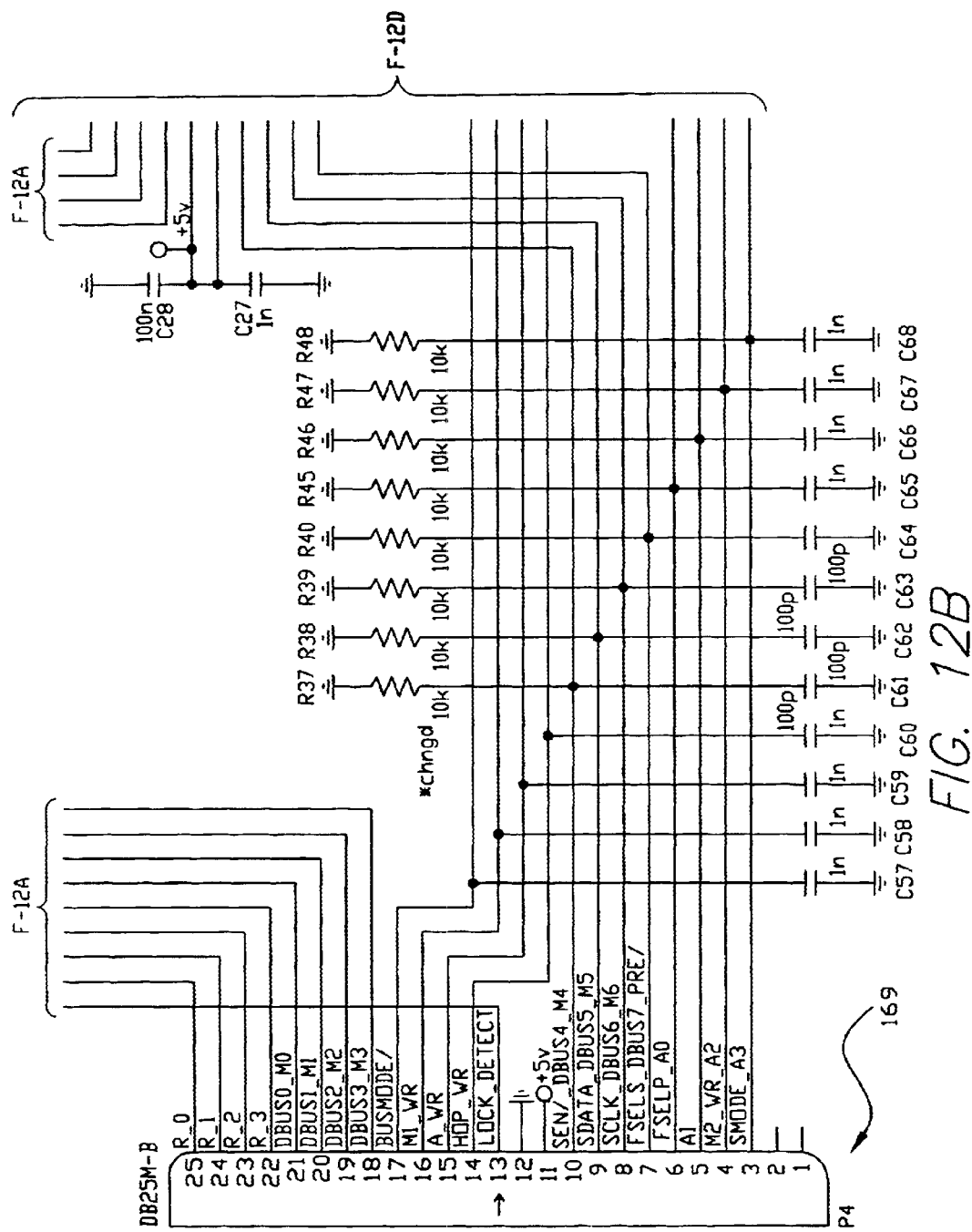
Figure 12C:
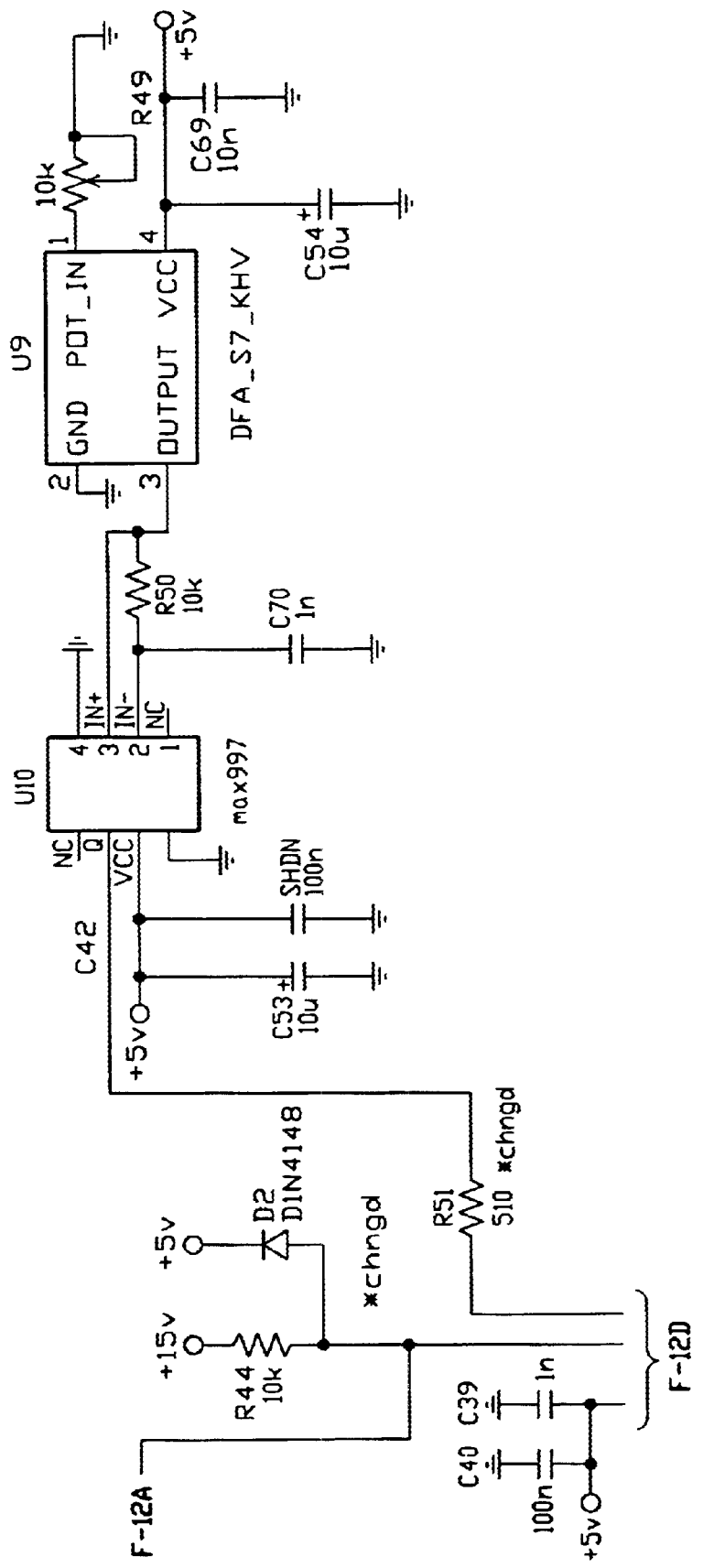
Figure 12D:
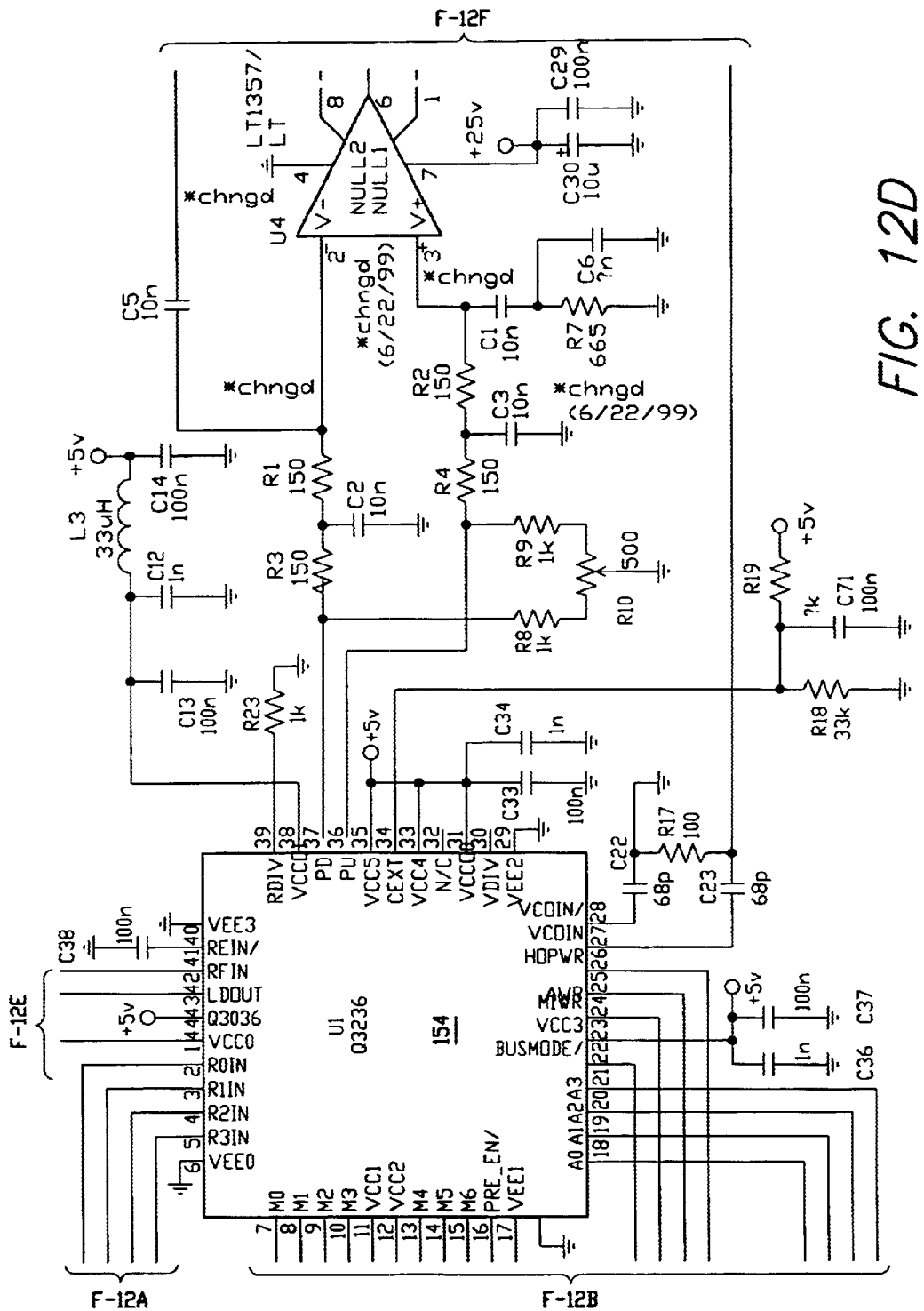
Figure 12E:
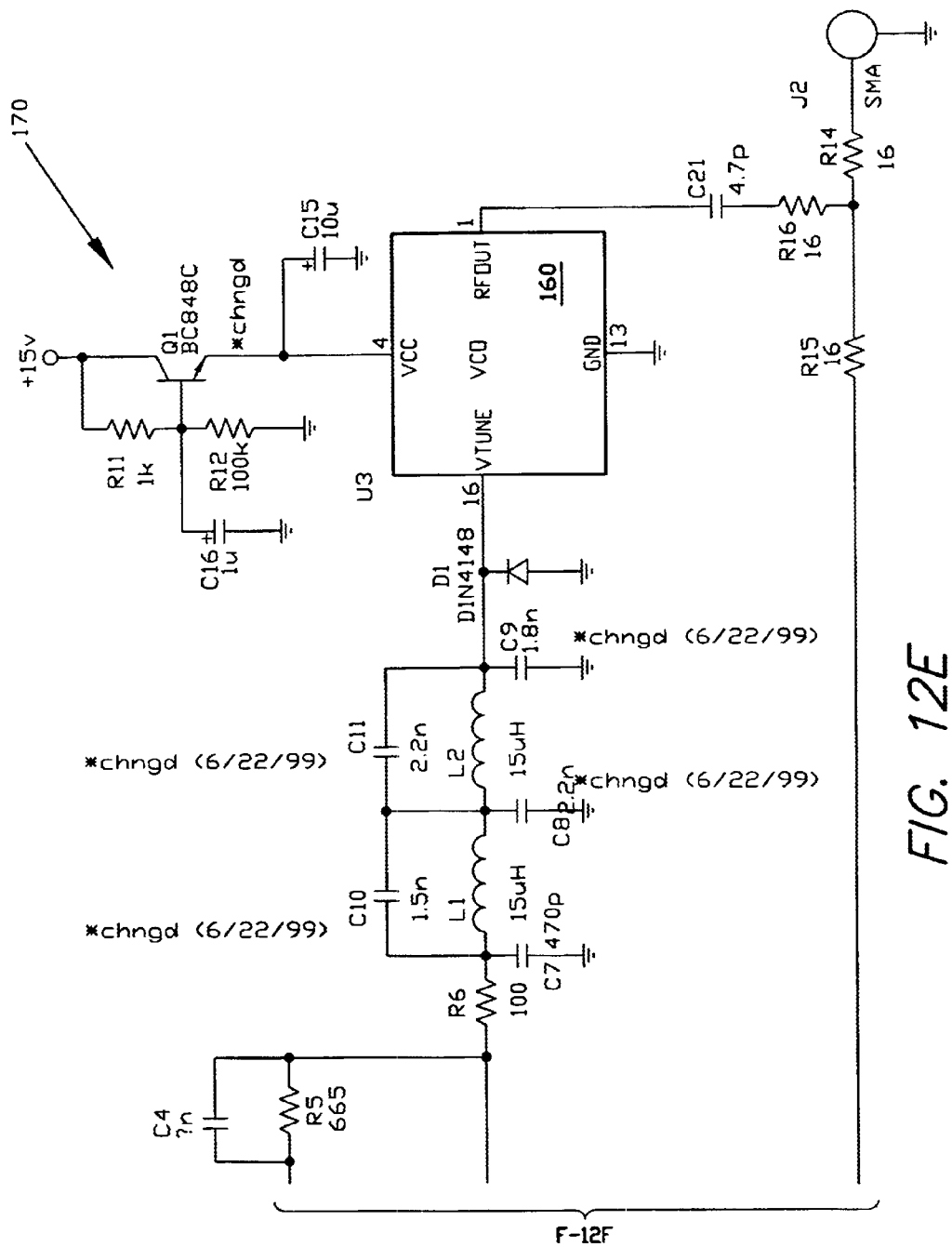
Figure 12F:
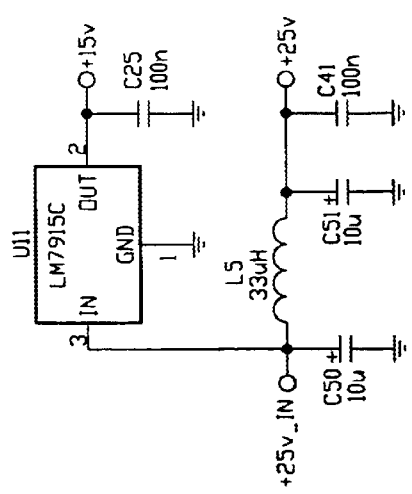
Figure 12G:
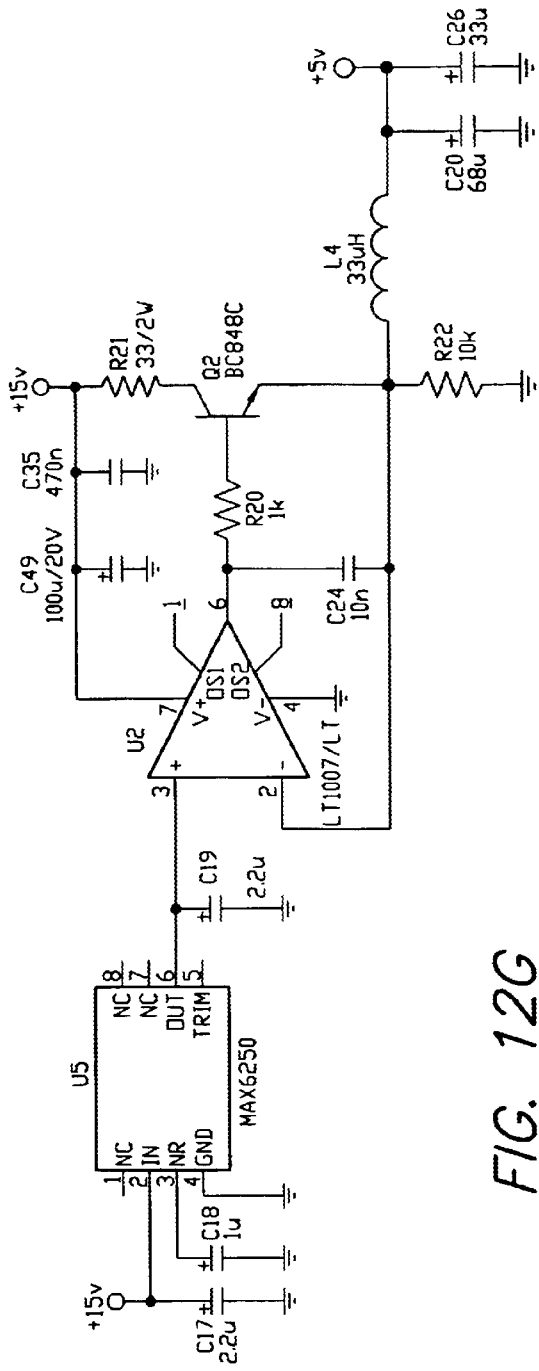

As noted in FIG. 1, the transceiver has a local oscillator 32 with a frequency output of 1.8 GHz. FIGS. 11 and 12 show a block diagram and partial schematic of a frequency synthesizer circuit used to generate the local oscillator signal. The frequency synthesizer uses a Qualcomm® Q3236™ phase locked loop integrated circuit 154 which is provided with an external reference frequency 156, an external R-C low pass filter 158, and an external voltage control oscillator 160 which has a portion of its output fed back to the Q3236 for error correction. Internally the chip 154 includes a reference divider 162, a phase detector 164, a frequency divider 166, and a prescaler 168. The Q3236 was designed for CDMA (code division multiple access) applications, and has a parallel data bus for operation at different frequencies at predetermined times under control of a microprocessor for frequency hopping in spread spectrum techniques. However, the Q3236 also has a mode in which the input to the data bus can be hard wired for operation at a single frequency. In the present application, this is accomplished by hardwiring the inputs to the parallel data bus through the voltages supplied at pins 25-22 (the R value), pins 21-18 and 10-8 (the M value) and pins 6-3 (the A value) of the DB25M-B connector 169 with binary values (+5 volts=1, ground=0) according to the formula:

$$Fout=Fref[(10(M+1)+A)/(R+1)]$$

where Fout is the desired frequency and Fref is the reference frequency. The Q3236 is hardwired to produce a local oscillator frequency of 1.8 GHz. At this frequency, the supply voltage for the VCO 160 may be rendered unstable, with resulting phase noise produced by the VCO. In order to prevent excessive phase noise, the VCO 160 is supplied with a constant current through transistor 170 Q1 instead of constant voltage, as shown in FIG. 12. The circuit in FIGS. 11 and 12 has been shown to produce a stable output frequency of 1.8 GHz with phase noise of −100 dBc/Hz at 10 kHz.

Figure 13:
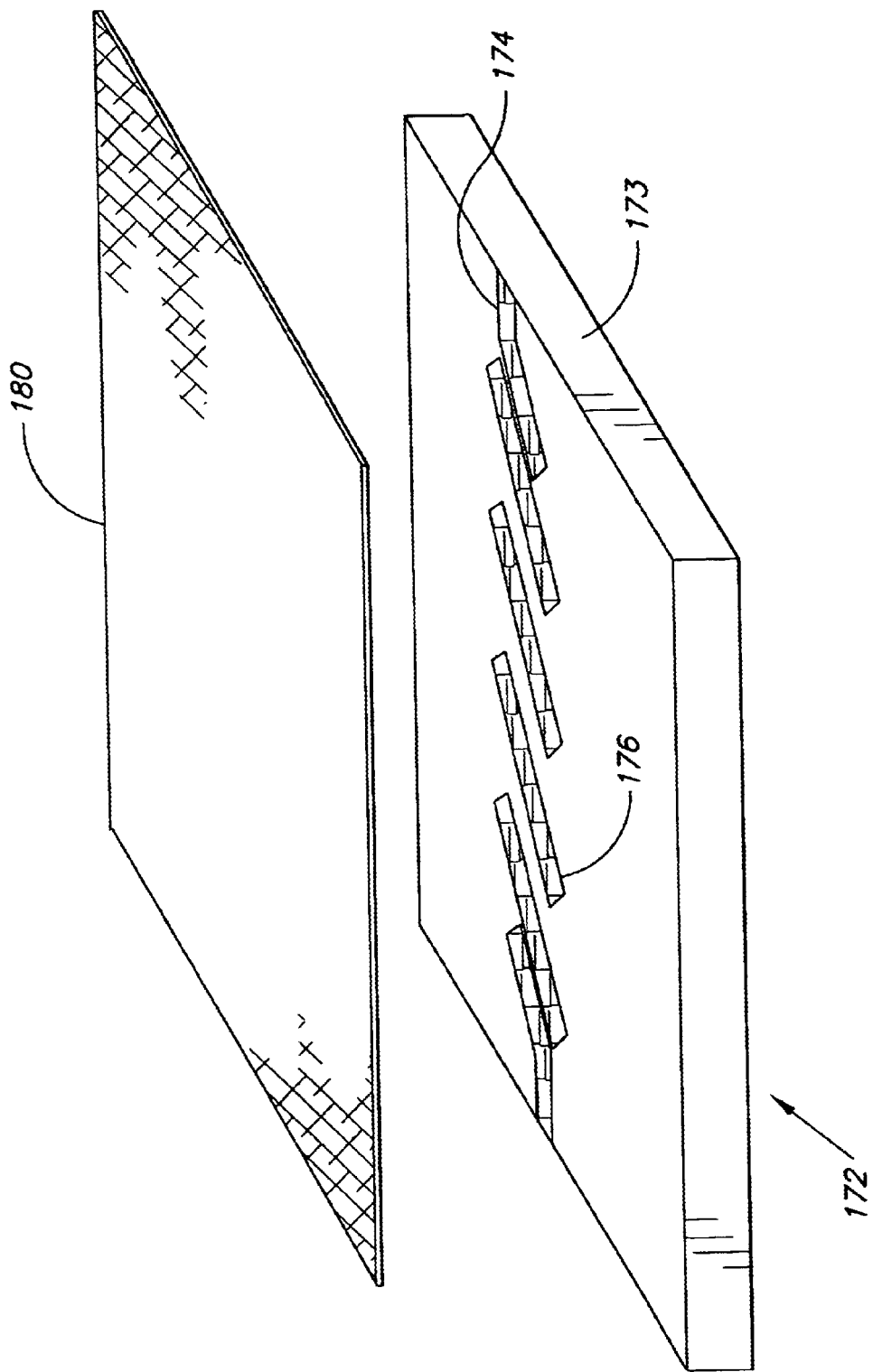
FIG. 13 is a diagrammatic, perspective view of a five-pole edge coupled bandpass filter according to the present invention.
Figure 14:
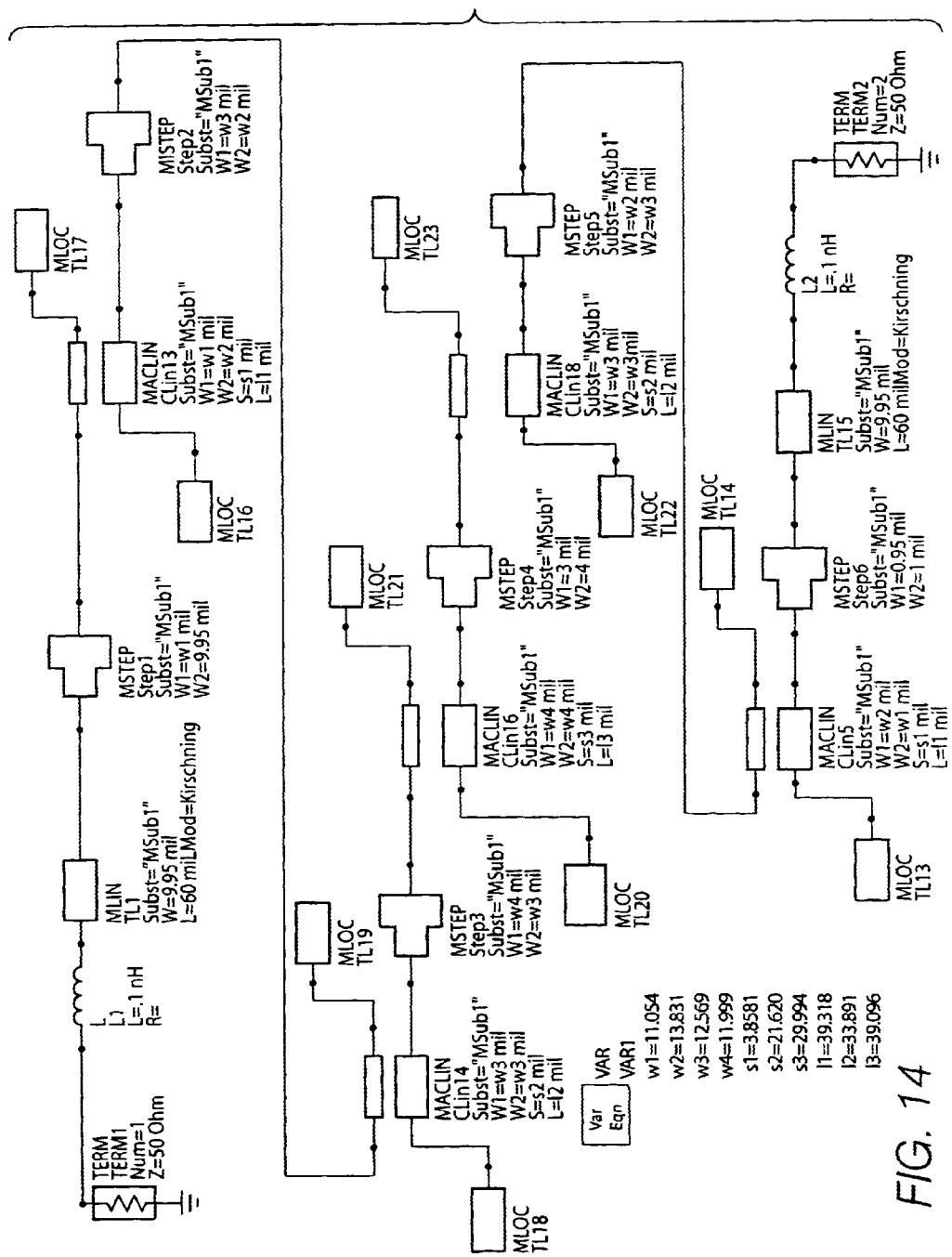
FIG. 14 is a schematic diagram of the five-pole bandpass filter according to the present invention.
Figure 15:
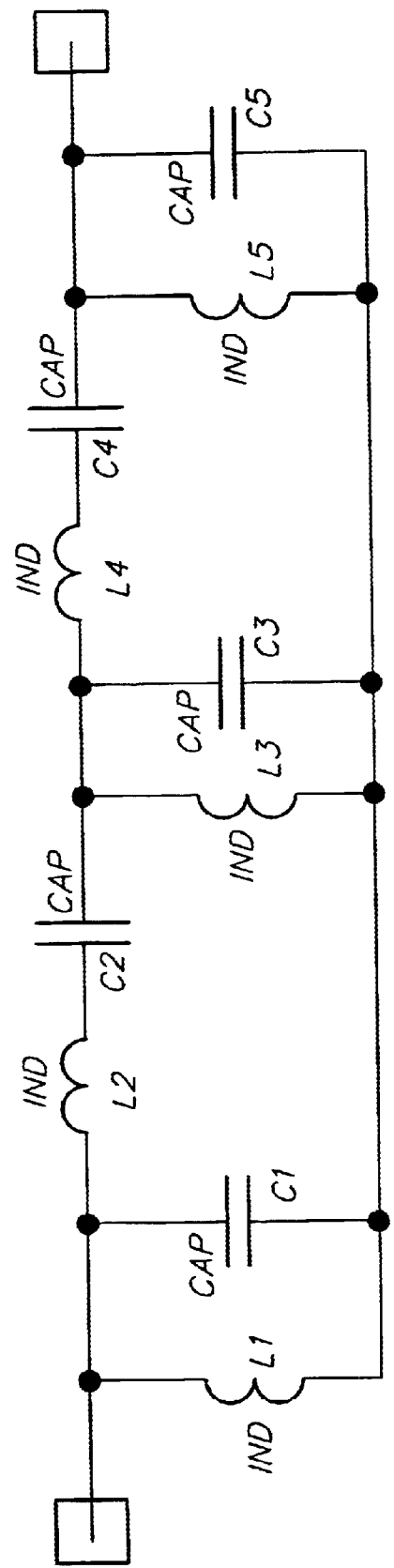
FIG. 15 is a schematic diagram of an equivalent circuit for the five-pole bandpass filter using lumped components.

FIGS. 13, 14 and 15 illustrate an optional five pole edge coupled bandpass filter which may be inserted between the driver amplifier 42 and the power amplifiers 44 to produce additional rejection of the local oscillator signal in higher power radios. As shown in FIG. 13, the filter 172 is formed from a plurality of thin film conductive metal strips deposited on a flat sheet 173 of dielectric material, preferably alumina. The strips include a filter input 174, five strips 176 embodying the five poles of the filter, and an output strip 178. The five strips 176 are generally parallel to each other, but the length of the strips 176 overlap so that each strip 176 is coupled to the adjacent strip 176 along only part of its length. Further, each strip 176 is not uniform in width, but has sections differing in length and width with predetermined spacing between the sections on each strip 176, the sections representing a distributed inductance, capacitance, or resistance element at microwave frequencies. The length, width, and spacing between the sections of each distributed element may be calculated from predetermined formulas, and the results of the calculations may be modeled using simulation software, preferably Ansoft Serenade from Ansoft Corporation, and particularly Ansoft Ensemble, which provides simulation of planar electromagnetic fields. A schematic diagram showing the length, width and spacing of the distributed elements is shown in FIG. 14. A schematic diagram of an equivalent circuit using lumped components is shown in FIG. 15 (lumped components are not generally used at microwave frequencies due to skin effect and inefficiency).

Coupled line filters are known in the art, although applicant is not aware of any edge coupled bandpass filters above 20 GHz. The innovation in the filter 172 of the present invention is a flat, planar, conductive metal lid 180 positioned above the strips 176 and sheet 173 and spaced apart from the sheet 173 by about 50–60 mils. It is thought that the metal lid 180 confines the electromagnetic field within the metallic lid, thereby increases the quality factor, Q, and providing a steep skirt, high rejection at the desired frequency, and low insertion loss. Testing of the filter 172 showed an average insertion loss of 3 dB over 27.5–28.5 GHz with a rejection of 21 dB at 26.5 GHz.

It is to be understood that the present invention is not limited to the embodiments described above, but encompasses any and all embodiments within the scope of the following claims. It will be further understood that the recitation of particular frequencies and dimensions in the foregoing specification is for purposes of illustration and enablement, the scope of the teaching and the following claims extending to any transceiver operating at millimeter wave frequencies.

We claim:

1. A complete outdoor radio unit for the Local Multipoint Distribution Service having a transceiver adapted for mounting to a housing at a rear side of a dish antenna, the transceiver comprising:
    a) a transmitter and a receiver operable to transmit and receive radio waves in the millimeter wavelength portion of the electromagnetic spectrum;
    b) a heat sink having a planar inner surface with gold plated copper and an outer surface having fins, the heat sink forming a housing rear wall and being adapted for attachment to a housing at a rear side of a dish antenna in order to form an air tight and waterproof transceiver enclosure;
    c) a power supply printed circuit board having a top surface with the power supply circuitry of said transceiver mounted thereon and a bottom surface defining a ground plane, the bottom surface being attached directly to said heat sink;
    d) an L-band microwave printed circuit board having a top surface with microwave intermediate frequency circuitry mounted thereon and a bottom surface defining a ground plane, the bottom surface being attached directly to said heat sink;
    e) a thermally and electrically conductive plate defining a millimeter ground plane, the millimeter ground plane being attached directly to said heat sink; and
    f) a millimeter microwave printed circuit board having a top surface with microwave circuitry operable in the millimeter wavelength band mounted thereon and a bottom surface defining a ground plane, the bottom surface being directly attached to said millimeter ground plane, whereby said transceiver has a substantially planar configuration with all of said printed circuit boards connected to said heat sink by thermally conductive paths for effective heat transfer.

2. The complete outdoor radio unit according to claim 1, wherein:
    a) said power supply printed circuit board and said L-band microwave printed circuit board are elastically attached to said heat sink by a thermally conductive epoxy; and
    b) said millimeter microwave printed circuit board is elastically attached to said heat sink by a thermally conductive epoxy, whereby said printed circuit boards may expand and contract without breaking during heating and cooling.

3. The complete outdoor radio unit according to claim 1, wherein said millimeter ground plane has a first cavity defining a bottom portion of a first waveguide transmission line and a second cavity defining a bottom portion of a second waveguide transmission line, the second cavity being configured in a direction orthogonal to said first cavity, said transceiver further comprising:
    a) an upper waveguide assembly mounted on said millimeter ground plane, said first and second waveguide transmission lines continuing through the upper waveguide assembly;
    b) an orthomodal transducer mounted on said upper waveguide assembly, said first and second waveguide transmission lines communicating with said orthomode transducer to transmit and receive radio waves having orthogonal polarization; and
    c) an antenna horn attached to said orthomodal transducer for transmitting and receiving radio waves, the antenna horn being adapted for insertion through an antenna dish.

4. The complete outdoor radio unit according to claim 3, wherein said millimeter microwave printed circuit board further comprises a transmitter launch point defined therein, the millimeter microwave printed circuit board being disposed between said millimeter ground plane and said upper waveguide housing with the transmitter launch point aligned in said first waveguide transmission line, the transmitter launch point having a first microstrip projecting into said first waveguide transmission line for introducing a signal to be transmitted into said first waveguide transmission line, the signal traveling through said first waveguide transmission line and said orthomodal transducer to said antenna horn, whereby the signal is transmitter without a wire feed line.

5. The complete outdoor radio unit according to claim 3, wherein said millimeter microwave printed circuit board further comprises a receiver launch point defined therein, the millimeter microwave printed circuit board being disposed between said millimeter ground plane and said upper waveguide housing with the receiver launch point aligned in said second waveguide transmission line, the receiver launch point having a second microstrip projecting into said second waveguide transmission line for receiving a signal received by said antenna horn and traveling through said orthomodal transducer and said second waveguide transmission line, whereby the signal is received without a wire feed line.

6. The complete outdoor radio unit according to claim 1, wherein said millimeter ground plane has an elongated third cavity defining a bottom portion of a transmitter waveguide bandpass filter and an elongated fourth cavity defining a bottom portion of a receiver waveguide bandpass filter, said transceiver further comprising an upper filter housing attached to said millimeter ground plane, the upper filter housing having a pair of elongated cavities defined therein aligned with said third and forth cavities, respectively, in order to define said transmitter and receiver waveguide bandpass filters, the upper filter housing having a transmitter input port and a transmitter output port defined therein in communication with said transmitter waveguide band pass filter and having a receiver input port and a receiver output port defined therein in communication with said receiver waveguide bandpass filter.

7. The complete outdoor radio unit according to claim 6, wherein said millimeter microwave printed circuit board further comprises:
    a) a third microstrip projecting into said transmitter input port for introducing an unfiltered transmitter signal into said transmitter waveguide bandpass filter;

b) a fourth microstrip projecting into said transmitter output port for receiving a filtered transmitter signal from said transmitter waveguide bandpass filter;

c) a fifth microstrip projecting into said receiver input port for introducing an unfiltered received signal into said receiver waveguide bandpass filter; and d) a sixth microstrip projecting into said receiver input port for receiving a filtered received signal from said receiver waveguide bandpass filter.

8. The complete outdoor radio unit according to claim 7, further comprising a removable insert defining a plurality of irises, the insert being removably disposed between said millimeter ground plane and said upper filter housing for altering the bandpass frequencies of said transmitter waveguide filter and said receiver waveguide filter.

9. The complete outdoor radio unit according to claim 1, further comprising a flexible cable connecting said L-band microwave printed circuit board and said millimeter microwave printed circuit board, said flexible cable comprising a plurality of coplanar, flat, thin film strip conductors embedded in polyimide.

10. The complete outdoor radio unit according to claim 9, wherein the plurality of conductors includes:

a) a plurality of direct current conductors for carrying direct current voltages and control signals; and b) a plurality of high frequency conductors for carrying intermediate frequencies at microwave wavelengths, each said high frequency conductor having a center conductor and a pair of wide ground plane conductors, the pair of ground plane conductors being on opposite sides of said center conductor, respectively.

11. The complete outdoor radio unit according to claim 1, wherein said power supply printed circuit board has a DC—DC converter mounted thereon, said DC—DC converter having a base plate and having a plurality of mounting pins for attachment of said DC—DC converter to said power supply printed circuit board, the base plate and the mounting pins extending to the same side of said DC—DC converter so that said base plate is connected to said heat sink by a thermally conductive path.

12. The complete outdoor radio unit according to claim 1, wherein said transceiver has a frequency synthesizer circuit for producing a local oscillator signal, the frequency synthesizer circuit comprising:

a) a phase locked loop frequency synthesizer integrated circuit having a parallel data bus adapted for producing a plurality of frequencies at predetermined time intervals in response to a microprocessor control signal;

b) a low pass filter electrically connected to the output of said frequency synthesizer integrated circuit;

c) a voltage controlled oscillator electrically connected to said low pass filter and producing an output signal; and d) a feedback loop connecting the output signal of said voltage controlled oscillator to said frequency synthesizer integrated circuit; and e) wherein said frequency synthesizer integrated circuit is hardwired to operate at a single frequency, the parallel data bus receiving binary voltage inputs so that said frequency synthesizer produces a local oscillator signal at a fixed microwave frequency.

13. The complete outdoor radio unit according to claim 12, wherein said frequency synthesizer circuit further comprises a transistor configured as a constant current source connected to a power supply pin on said voltage controlled oscillator for reducing phase noise.

14. The complete outdoor radio unit according to claim 1, further comprising an edge coupled bandpass filter in said transmitter.

15. The complete outdoor radio unit according to claim 14, wherein said edge coupled bandpass filter comprises:

a) a flat board made from a dielectric material;

b) a plurality of flat, conductive strips deposited on said flat board, the conductive strips having a predetermined shape and spacing presenting distributed inductive, capacitive and resistive effects to an electronic signal inserted into the filter; and c) a flat, planar, electrically conductive lid disposed above said board and said conductive strips, being spaced apart from said board by a predetermined distance.

16. The complete outdoor radio unit according to claim 15, wherein said plurality of conductive strips is shaped, spaced and configured as a bandpass filter at frequencies greater than or equal to 20 GHz.

17. The complete outdoor radio unit according to claim 15, wherein said plurality of conductive strips is shaped, spaced and configured as a five pole bandpass filter.

18. The complete outdoor radio unit according to claim 15, wherein said lid is spaced apart from said conductive strips by between about 50 to 60 mils.

19. The complete outdoor radio unit according to claim 1, further comprising:

a) an antenna horn;

b) a first waveguide connecting said millimeter microwave printed circuit board with said antenna horn, the first waveguide coupling a transmitter signal from said millimeter microwave printed circuit board to said antenna horn without a coaxial feed line; and c) a second waveguide connecting said millimeter microwave printed circuit board with said antenna horn, the second waveguide coupling a received signal from said antenna horn to said millimeter microwave printed circuit board without a coaxial feed line.

20. The complete outdoor radio unit according to claim 1, further comprising a transmitter waveguide bandpass filter integral with said millimeter ground plane and a receiver waveguide bandpass filter integral with said millimeter ground plane, said transceiver further comprising a removable insert disposed in said waveguide filters for adjusting the band of frequencies passed by said filters.

* * * * *